(12) United States Patent
Feng et al.

(10) Patent No.: US 11,081,061 B2
(45) Date of Patent: Aug. 3, 2021

(54) SHIFT REGISTER, GATE DRIVING CIRCUIT, DISPLAY DEVICE AND GATE DRIVING METHOD

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI XINSHENG OPTOELECTRONICS TECHNOLOGY CO., LTD., Anhui (CN); BOE TECHNOLOGY GROUP CO., LTD., Anhui (CN)

( * ) Notice: Subject to any disclaimer, the term of this patent is extended or adjusted under 35 U.S.C. 154(b) by 0 days.

(21) Appl. No.: 16/633,082

(22) PCT Filed: Jul. 31, 2019

(86) PCT No.: PCT/CN2019/098612
§ 371 (c)(1),
(2) Date: Jan. 22, 2020

(87) PCT Pub. No.: WO2020/024985
PCT Pub. Date: Feb. 6, 2020

(65) Prior Publication Data
US 2021/0065630 A1 Mar. 4, 2021

(30) Foreign Application Priority Data
Aug. 1, 2018 (CN) .......................... 201810862311.7

(51) Int. Cl.
*G09G 3/3266* (2016.01)

(52) U.S. Cl.
CPC ... *G09G 3/3266* (2013.01); *G09G 2300/0408* (2013.01); *G09G 2300/0819* (2013.01);
(Continued)

(58) Field of Classification Search
CPC .............. G11C 19/287; G09G 3/3266; G09G 2300/0408; G09G 2310/0286;
(Continued)

(56) References Cited

U.S. PATENT DOCUMENTS

2014/0118237 A1    5/2014   Wang

FOREIGN PATENT DOCUMENTS

CN    105185294 A    12/2015
CN    106683634 A    5/2017
(Continued)

OTHER PUBLICATIONS

The First Office Action dated Apr. 17, 2020 corresponding to Chinese application No. 201810862311.7.

*Primary Examiner* — Michael J Eurice
(74) *Attorney, Agent, or Firm* — Nath, Goldberg & Meyer; Joshua B. Goldberg

(57) ABSTRACT

The present application provides a shift register, a gate driving circuit, a display device and a gate driving method. The shift register includes an input circuit, an inverter circuit and an output circuit. The input circuit, the inverter circuit and the output circuit are coupled to a pull-up node, and the output circuit and the inverter circuit are coupled to a pull-down node. The input circuit is configured to control a voltage at the pull-up node in response to an input signal. The inverter circuit is configured to invert the voltage at the pull-up node and output the inverted voltage to the pull-down node. The output circuit is configured to output a (Continued)

multi-pulse signal within a duration of one frame under control of the voltage at the pull-up node and a voltage at the pull-down node.

19 Claims, 12 Drawing Sheets

(52) U.S. Cl.
CPC ............... *G09G 2310/0286* (2013.01); *G09G 2310/061* (2013.01); *G09G 2310/066* (2013.01); *G09G 2330/028* (2013.01)

(58) Field of Classification Search
CPC ......... G09G 2310/06; G09G 2310/061; G09G 2310/066; G09G 2310/08; G09G 2330/028; G09G 2300/0819
See application file for complete search history.

(56) References Cited

FOREIGN PATENT DOCUMENTS

| | | |
|---|---|---|
| CN | 107993607 A | 5/2018 |
| CN | 109949749 A | 6/2019 |
| KR | 1020130115908 A | 10/2013 | ns
SHIFT REGISTER, GATE DRIVING CIRCUIT, DISPLAY DEVICE AND GATE DRIVING METHOD

CROSS REFERENCE TO RELATED APPLICATION

This is a National Phase Application filed under 35 U.S.C. 371 as a national stage of PCT/CN2019/098612, filed on Jul. 31, 2019, an application claiming priority to Chinese patent application No. 201810862311.7, filed on Aug. 1, 2018, the entire contents of each of which are incorporated herein by reference.

TECHNICAL FIELD

The present disclosure relates to the field of display technologies, and in particular, to a shift register, a gate driving circuit, a display device and a gate driving method.

BACKGROUND

In order to achieve a narrow bezel of a display device, a gate driving circuit (i.e., gate driver-on-array (GOA) circuit) integrated on an array substrate has been developed. The gate driving circuit includes a plurality of shift registers that are cascaded for generating a plurality of driving signals to perform progressive scanning through a plurality of gate lines. This is an effective way of driving an array of thin film transistor-based pixels in a display panel to display image frames one by one on the display panel.

SUMMARY

In an aspect, the present disclosure provides a shift register, including an input circuit, an inverter circuit and an output circuit, the input circuit, the inverter circuit and the output circuit being coupled to a pull-up node, the output circuit and the inverter circuit being coupled to a pull-down node, wherein the input circuit is configured to control a voltage at the pull-up node in response to an input signal; the inverter circuit is configured to invert the voltage at the pull-up node and output the inverted voltage to the pull-down node; and the output circuit is configured to output a multi-pulse signal within a duration of one frame under control of voltage at the pull-up node and a voltage at the pull-down node.

In some embodiments, the input circuit includes a display pre-charge reset circuit, a sensing cascade circuit and a sensing pre-charge reset circuit;

the sensing cascade circuit and the sensing pre-charge reset circuit are coupled to a sensing cascade node, and the display pre-charge reset circuit, the sensing pre-charge reset circuit and the output circuit are coupled to the pull-up node;

the display pre-charge reset circuit is coupled to a first signal input terminal, a reset signal terminal, a first power supply terminal and a second power supply terminal, and is configured to write a first operating voltage in an active level state provided by the first power supply terminal to the pull-up node in response to control of a first input signal provided by the first signal input terminal in a display pre-charge period, and to write a second operating voltage in an inactive level state provided by the second power supply terminal to the pull-up node in response to control of a reset signal provided by the reset signal terminal in a display reset period;

the sensing cascade circuit is coupled to a second signal input terminal and a second clock signal terminal, and is configured to write a second input signal in an active level state provided by the second signal input terminal to the sensing cascade node in response to control of a second clock signal provided by the second clock signal terminal in a sensing cascade period;

the sensing pre-charge reset circuit is coupled to a first clock signal terminal, the second clock signal terminal, a third clock signal terminal and the second power supply terminal, and is configured to write a third clock signal in an active level state provided by the third clock signal terminal to the pull-up node in response to control of a voltage at the sensing cascade node and a first clock signal provided by the first clock signal terminal in a sensing pre-charge period, and to write the second operating voltage in an inactive level state provided by the second power supply terminal to the pull-up node in response to control of the second clock signal provided by the second clock signal terminal in a sensing reset period;

wherein the output circuit is coupled to at least one signal output terminal and includes at least one output sub-circuit in one-to-one correspondence with the at least one signal output terminal, wherein an output sub-circuit of the at least one output sub-circuit is coupled to the pull-up node, the pull-down node, a corresponding signal output terminal, a corresponding driving clock signal terminal and a corresponding reset power supply terminal, is configured to write a driving clock signal provided by the corresponding driving clock signal terminal to the corresponding signal output terminal in response to control of the voltage at the pull-up node in an active level state in a display output period and a sensing output period, and is configured to write a reset operating voltage in an inactive level state provided by the corresponding reset power supply terminal to the corresponding signal output terminal in response to control of the voltage at the pull-down node in an active level state in the display reset period and the sensing reset period.

In some embodiments, the display pre-charge reset circuit includes a first display transistor and a second display transistor;

a control electrode of the first display transistor is coupled to the first signal input terminal, a first electrode of the first display transistor is coupled to the first power supply terminal, and a second electrode of the first display transistor is coupled to the pull-up node; and a control electrode of the second display transistor is coupled to the reset signal terminal, a first electrode of the second display transistor is coupled to the pull-up node, and a second electrode of the second display transistor is coupled to the second power supply terminal.

In some embodiments, the shift register further includes an anti-leakage circuit, wherein:

the anti-leakage circuit includes a first anti-leakage transistor and a second anti-leakage transistor, and the second electrode of the second display transistor is coupled to the second power supply terminal through the second anti-leakage transistor;

a control electrode of the first anti-leakage transistor is coupled to one of the at least one signal output terminal, a first electrode of the first anti-leakage transistor is coupled to the second electrode of the second display transistor and a first electrode of the second anti-leakage transistor, and a second electrode of the first anti-leakage transistor is coupled to one of the at least one signal output terminal; and a control electrode of the second anti-leakage transistor is coupled to the control electrode of the second display transistor, the first electrode of the second anti-leakage transistor is coupled to the second electrode of the second display transistor, and a second electrode of the second anti-leakage transistor is coupled to the second power supply terminal.

In some embodiments, the inverter circuit includes a third display transistor, a fourth display transistor and a fifth display transistor;

a control electrode of the third display transistor is coupled to a third power supply terminal, a first electrode of the third display transistor is coupled to the third power supply terminal, and a second electrode of the third display transistor is coupled to the pull-down node;

a control electrode of the fourth display transistor is coupled to a fourth power supply terminal, a first electrode of the fourth display transistor is coupled to the fourth power supply terminal, and a second electrode of the fourth display transistor is coupled to the pull-down node;

a control electrode of the fifth display transistor is coupled to the pull-up node, a first electrode of the fifth display transistor is coupled to the pull-down node, and a second electrode of the fifth display transistor is coupled to the second power supply terminal; and a third operating voltage provided by the third power supply terminal and a fourth operating voltage provided by the fourth power supply terminal are both switched between an active level state and an inactive level state once every preset period, and one of the third operating voltage and the fourth operating voltage is in an active level state and the other is in an inactive level state at any time.

In some embodiments, the output sub-circuit includes a sixth display transistor and a seventh display transistor;

a control electrode of the sixth display transistor is coupled to the pull-up node, a first electrode of the sixth display transistor is coupled to the corresponding driving clock signal terminal, and a second electrode of the sixth display transistor is coupled to the corresponding signal output terminal; and a control electrode of the seventh display transistor is coupled to the pull-down node, a first electrode of the seventh display transistor is coupled to the corresponding signal output terminal, and a second electrode of the seventh display transistor is coupled to the corresponding reset power supply terminal.

In some embodiments, the shift register further includes a first capacitor;

a first terminal of the first capacitor is coupled to the pull-up node, and a second terminal of the first capacitor is coupled to a signal output terminal of the at least one signal output terminal.

In some embodiments, a number of the at least one signal output terminal is 1 to 4.

In some embodiments, the shift register further includes a noise reduction circuit, wherein the noise reduction circuit includes an eighth display transistor; and a control electrode of the eighth display transistor is coupled to the pull-down node, a first electrode of the eighth display transistor is coupled to the pull-up node, and a second electrode of the eighth display transistor is coupled to the second power supply terminal.

In some embodiments, the shift register further includes an anti-leakage circuit, wherein:

the anti-leakage circuit includes a first anti-leakage transistor and a third anti-leakage transistor, and the second electrode of the eighth display transistor is coupled to the second power supply terminal through the third anti-leakage transistor;

a control electrode of the first anti-leakage transistor is coupled to one of the at least one signal output terminal, a first electrode of the first anti-leakage transistor is coupled to the second electrode of the eighth display transistor and a first electrode of the third anti-leakage transistor, and a second electrode of the first anti-leakage transistor is coupled to one of the at least one signal output terminal; and a control electrode of the third anti-leakage transistor is coupled to the control electrode of the eighth display transistor, the first electrode of the third anti-leakage transistor is coupled to the second electrode of the eighth display transistor, and a second electrode of the third anti-leakage transistor is coupled to the second power supply terminal.

In some embodiments, the sensing cascade circuit includes a first sensing transistor; and a control electrode of the first sensing transistor is coupled to the second clock signal terminal, a first electrode of the first sensing transistor is coupled to the second signal input terminal, and a second electrode of the first sensing transistor is coupled to the sensing cascade node.

In some embodiments, the shift register further includes a second capacitor;

a first terminal of the second capacitor is coupled to the sensing cascade node, and a second terminal of the second capacitor is coupled to a fifth power supply terminal.

In some embodiments, the sensing pre-charge reset circuit includes a second sensing transistor, a third sensing transistor and a fourth sensing transistor;

a control electrode of the second sensing transistor is coupled to the sensing cascade node, a first electrode of the second sensing transistor is coupled to the third clock signal terminal, and a second electrode of the second sensing transistor is coupled to a first electrode of the third sensing transistor;

a control electrode of the third sensing transistor is coupled to the first clock signal terminal, and a second electrode of the third sensing transistor is coupled to the pull-up node; and a control electrode of the fourth sensing transistor is coupled to the second clock signal terminal, a first electrode of the fourth sensing transistor is coupled to the pull-up node, and a second electrode of the fourth sensing transistor is coupled to the second power supply terminal.

In some embodiments, the shift register further includes an anti-leakage circuit, wherein the anti-leakage circuit includes a first anti-leakage transistor, a fourth anti-leakage transistor and a fifth anti-leakage transistor, the first electrode of the third sensing transistor is coupled to the second electrode of the second sensing transistor through the fourth anti-leakage transistor, and the second electrode of the fourth sensing transistor is coupled to the second power supply terminal through the fifth anti-leakage transistor;

a control electrode of the first anti-leakage transistor is coupled to one of the at least one signal output terminal, a first electrode of the first anti-leakage transistor is coupled to the first electrode of the third sensing transistor, a second electrode of the fourth anti-leakage transistor, the second electrode of the fourth sensing transistor and a first electrode of the fifth anti-leakage transistor, and a second electrode of the first anti-leakage transistor is coupled to one of the at least one signal output terminal;

a control electrode of the fourth anti-leakage transistor is coupled to the control electrode of the third sensing transistor, a first electrode of the fourth anti-leakage transistor s coupled to the second electrode of the second sensing transistor, and the second electrode of the fourth anti-leakage transistor is coupled to the first electrode of the third sensing transistor and a control electrode of the fifth anti-leakage transistor is coupled to the control electrode of the fourth sensing transistor, the first electrode of the fifth anti-leakage transistor is coupled to the second electrode of the fourth sensing transistor, and a second electrode of the fifth anti-leakage transistor is coupled to the second power supply terminal.

In some embodiments, the one signal output terminal coupled to the control electrode of the first anti-leakage transistor and the one signal output terminal coupled to the second electrode of the first anti-leakage transistor are the same signal output terminal.

In some embodiments, the one signal output terminal coupled to the control electrode of the first anti-leakage transistor and the one signal output terminal coupled to the second electrode of the first anti-leakage transistor are different signal output terminals.

In some embodiments, the output circuit includes a first signal output terminal and a second signal output terminal, the first signal output terminal is configured to provide a cascade signal to a second shift register or configured to provide a driving signal to a gate line coupled to the first signal output terminal, and the second signal output terminal is configured to provide a driving signal to a gate line coupled to the second signal output terminal.

In some embodiments, the output circuit includes a first signal output terminal, a second signal output terminal and a third signal output terminal;

the first signal output terminal is configured to provide a cascade signal to a second shift register;

the second signal output terminal is configured to provide a cascade signal to a third shift register or is configured to provide a driving signal to a first gate line coupled to the second signal output terminal; and the third signal output terminal is configured to provide a driving signal to a second gate line coupled to the third signal output terminal.

In some embodiments, the output circuit includes a first signal output terminal, a second signal output terminal, a third signal output terminal and a fourth signal output terminal;

the first signal output is configured to provide a cascade signal to a second shift register;

the second signal output is configured to provide a cascade signal to a third shift register;

the third signal output terminal is configured to provide a driving signal to a first gate line coupled to the third signal output terminal; and the fourth signal output terminal is configured to provide a driving signal to a second gate line coupled to the fourth signal output terminal.

In another aspect, the present disclosure provides a gate driving circuit, including N shift registers that are cascaded, each of the N shift registers is any one of the shift registers described herein;

first signal input terminals of the shift registers in first and second stages are coupled to a frame start signal input terminal, a first signal input terminal of the shift register in an i-th stage is coupled to a signal output terminal of the shift register in an (i−2)-th stage, where 3≤i≤N, and i is a positive integer;

a second signal input terminal of the shift register in the first stage is coupled to a sensing start signal input terminal, and a second signal input terminal of the shift register in a j-th stage is coupled to a signal output terminal of the shift register in a (j−1)-th stage, where 2≤j≤N, and j is a positive integer; and reset signal terminals of the shift registers in (N−2)-th to N-th stages are coupled to a frame reset signal terminal, and a reset signal terminal in a k-th stage is coupled to a signal output terminal of the shift register in a (k+3)-th stage, where 1≤k≤N−3, and k is a positive integer.

In some embodiments, the shift register in each stage is coupled to three corresponding signal output terminals, which are a first cascade signal output terminal, a second cascade signal output terminal and a first driving signal output terminal;

the first signal input terminal of the shift register in the i-th stage is coupled to the first cascade signal output terminal of the shift register in the (i−2)-th stage;

the second signal input terminal of the shift register in the j-th stage is coupled to the second cascade signal output terminal of the shift register in the (j−1)-th stage;

the reset signal terminal of the shift register in the k-th stage is coupled to the first cascade signal output terminal of the shift register in the (k+3)-th stage; and the first driving signal output terminal of the shift register in each stage is coupled to a gate line in a corresponding row.

In another aspect, the present disclosure provides a display device, including any one of the gate driving circuits described herein.

In another aspect, the present disclosure provides a gate driving method based on a shift register, the shift register adopting any one of the shift registers described herein, and the gate driving method including:

in the sensing cascade period, writing, by the sensing cascade circuit, the second input signal in an active level state provided by the second signal input terminal to the sensing cascade node in response to the control of the second clock signal provided by the second clock signal terminal;

in the display pre-charge period, writing, by the display pre-charge reset circuit, the first operating voltage in an active level state provided by the first power supply terminal to the pull-up node in response to the control of the first input signal provided by the first signal input terminal;

in the display output period, writing, by the output sub-circuit, the driving clock signal provided by the corresponding driving clock signal terminal to the corresponding signal output terminal in response to the control of the voltage at the pull-up node in an active level state;

in the display reset period, writing, by the display pre-charge reset circuit, the second operating voltage in an inactive level state provided by the second power supply terminal to the pull-up node in response to the control of the reset signal provided by the reset signal terminal; and writing, by the output sub-circuit, the reset operating voltage in an inactive level state provided by the corresponding reset power supply terminal to the corresponding signal output terminal in response to the control of the voltage at the pull-down node in an active level state;

in the sensing pre-charge period, writing, by the sensing pre-charge reset circuit, the third clock signal in an active level state provided by the third clock signal terminal to the pull-up node in response to the control of the voltage at the sensing cascade node and the first clock signal provided by the first clock signal terminal;

in the sensing output period, writing, by the output sub-circuit, the driving clock signal provided by the corresponding driving clock signal terminal to the corresponding signal output terminal in response to the control of the voltage at the pull-up node in an active level state; and in the sensing reset period, writing, by the sensing precharge reset circuit, the second operating voltage in an inactive level state provided by the second power supply terminal to the pull-up node in response to the control of the second clock signal provided by the second clock signal terminal; and writing, by the output sub-circuit, the reset operating voltage in an inactive level state provided by the corresponding reset power supply terminal to the corresponding signal output terminal in response to the control of the voltage at the pull-down node in an active level state.

DETAILED DESCRIPTION

Figure 1:
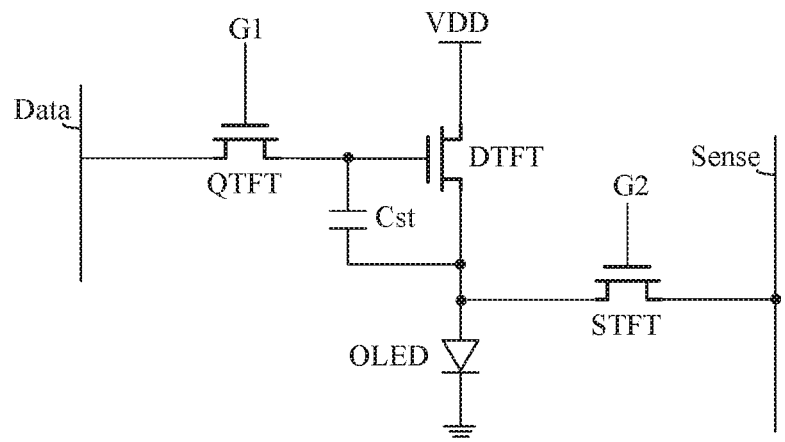
FIG. 1 is a schematic circuit diagram of a pixel circuit in an organic light emitting diode display panel.

In order to make those skilled in the art better understand the technical solutions of the present disclosure, the shift register, the gate driving circuit, the display device and the gate driving method provided in the present disclosure are described in detail below with reference to the accompanying drawings.

It should be noted that the transistor in the present disclosure may be a thin film transistor or a field effect transistor or other switching device with the same characteristics. A transistor generally includes three electrodes: a gate electrode, a source electrode and a drain electrode. The source electrode and the drain electrode in a transistor are symmetrical in structure and are interchangeable as required. In the present disclosure, the control electrode refers to a gate electrode of a transistor, and one of the first electrode and the second electrode is a source electrode and the other is a drain electrode.

Further, transistors can be classified into N-type transistors and P-type transistors according to their characteristics. In a case where the transistor is an N-type transistor, the turn-on voltage of the transistor is a high level voltage, and the turn-off voltage of the transistor is a low level voltage; and in a case where the transistor is a P-type transistor, the turn-on voltage of the transistor is a low level voltage and the turn-off voltage of the transistor is a high level voltage. The "active level" in the present disclosure refers to a voltage capable of controlling the corresponding transistor to be turned on, and the "inactive level" refers to a voltage capable of controlling the corresponding transistor to be turned off. Thus, when the transistor is an N-type transistor, the active level refers to a high level, and the inactive level refers to a low level; when the transistor is a P-type transistor, the active level refers to a low level and the inactive level refers to a high level.

In the following description of the embodiments, the transistors are exemplified as being N-type transistors. In this case, the active level refers to a high level, and the inactive level refers to a low level. Those skilled in the art will appreciate that the transistors in the embodiments described below may also be replaced with P-type transistors without departing from the spirit and scope of the present disclosure.

In the related art, thin film transistors (TFTs) are integrated on an array substrate by using a GOA technology to scan and drive gate lines in a display panel, so that a gate driver IC (integrated circuit) can be omitted, which is beneficial to realizing a narrow bezel.

For a display panel with an external compensation function, each gate driving sub-circuit in a gate driving circuit (composed of a plurality of gate driving sub-circuits that are cascaded) is required not only to output a driving signal for controlling the display switching transistor to be turned on in a display driving period, but also to output a driving signal for controlling the sensing switching transistor to be turned on in a sensing period, that is, the gate driving sub-circuit needs to have a function of outputting double pulses. However, since the conventional shift register can output only a single pulse signal, the conventional gate driving sub-circuit including only one shift register cannot satisfy the driving requirement.

In the related art, a gate driving sub-circuit having two shift registers and one signal combining circuit is also proposed. The gate driving sub-circuit has a function of outputting double pulses. However, the design solution of the gate driving sub-circuit including two shift registers and one signal combining circuit requires a large number of TFTs, which is not favorable for narrow-bezel implementation.

For an Organic Light Emitting Diode (OLED) display panel with an external compensation function, one frame can be divided into two periods: a display driving period and a sensing period. In the display driving period, pixel units in each row in the display panel complete display driving; and in the sensing period, a row of pixel units in the display panel completes current extraction sensing).

Figure 2:
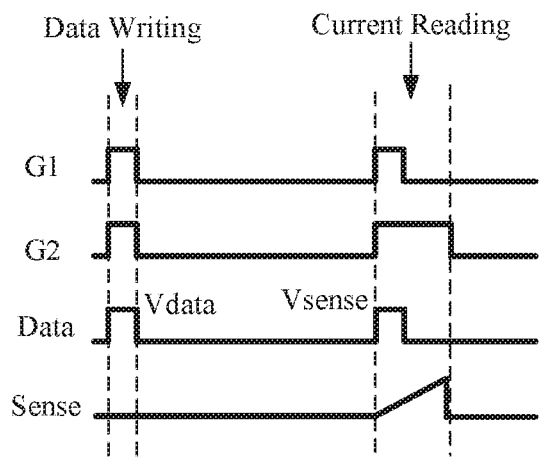
FIG. 2 is a timing diagram illustrating the operation of the pixel circuit shown in FIG. 1.

FIG. 1 is a schematic circuit diagram of a pixel circuit in an organic light emitting diode display panel, and FIG. 2 is a timing diagram illustrating the operation of the pixel circuit shown in FIG. 1. As shown in FIGS. 1 and 2, the pixel circuit includes a display switching transistor QTFT (the control electrode of which is coupled to a gate line G1), a driving transistor DTFT, a sensing switching transistor STFT (the control electrode of which is coupled to a gate line G2), and a capacitor Cst. When the pixel circuit only needs external compensation, the operation of the pixel circuit at least includes the following two periods: a pixel driving period (including a data voltage writing process) and a pixel sensing period (including a current reading process).

In the pixel driving period, a data voltage Vdata in a data line Data needs to be written to a pixel unit; and in the pixel sensing period, a test voltage Vsense needs to be written to the pixel unit through the data line Data, and an electric signal at the drain electrode of the driving transistor needs to be read to the signal reading line Sense through the sensing switching transistor STFT. In both the data writing process and the current reading process, an active level voltage needs to be written to the gate electrode of the sensing switching transistor STFT through the corresponding gate line G2.

It should be noted that, the process of performing external compensation on the pixel unit in the OLED display panel belongs to the conventional technology in the art, and the specific compensation process and the principle thereof are not described herein again.

Since the duration of the data writing process is longer than that of the current reading process, the gate line G2 coupled to the gate electrode of the sensing switching transistor SIFT needs to output a double-pulse signal within the period of one frame, and the width of the pulse corresponding to the current reading process is larger than that of the pulse corresponding to the data writing process. Therefore, the gate driving sub-circuit is required to have a function of outputting two pulses with different widths.

Figure 3:
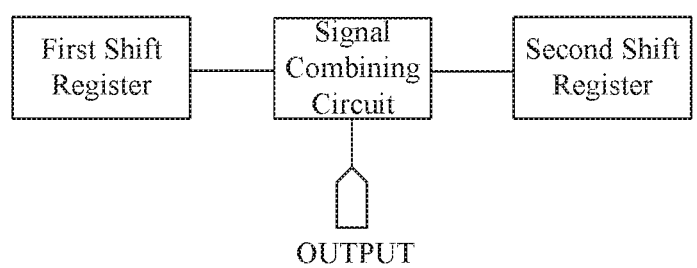
FIG. 3 is a schematic structural diagram of a gate driving sub-circuit in the related art.

FIG. 3 is a schematic structural diagram of a gate driving sub-circuit in the related art. As shown in FIG. 3, in order to realize that the gate driving sub-circuit can output a double-pulse signal, a first shift register, a second shift register and a signal combining circuit are used to form a gate driving sub-circuit in the related art. In the gate driving circuit, first shift registers in gate driving sub-circuits are cascaded, second shift registers in the gate driving sub-circuits are cascaded, the first shift registers are configured to output driving signals for driving the sensing switching transistors in a display driving period and the second shift registers are configured to output driving signals for driving the sensing switching transistors in a sensing period, and the signal combining circuit combines the driving signals output by two shift registers in the same gate driving sub-circuit as the signal combining circuit and outputs a double-pulse signal through a signal output terminal OUTPUT to meet the driving requirement.

Although the technical solution of constituting the gate driving sub-circuit by two shift registers and one signal combining circuit can meet the driving requirement, the structure is complex, the number of required transistors is large, and the narrow-bezel design is not facilitated.

Accordingly, the present disclosure provides, inter alia, a shift register, a gate driving circuit, a display device and a gate driving method that substantially obviate one or more of the problems due to limitations and disadvantages of the related art.

The shift register provided by the technical solution of the present disclosure has the function of outputting double pulses, and can meet the driving requirements of the pixel circuit in the pixel driving period and the pixel sensing period, so that the shift register according to the present disclosure can be independently used as a gate driving sub-circuit. Compared with the technical solution that the gate driving sub-circuit includes two shift registers and one signal combining circuit in the related art, the technical solution of the present disclosure can greatly reduce the number of TFTs in the gate driving sub-circuit, and is beneficial to the narrow-bezel implementation.

In an aspect, the present disclosure provides a shift register including an input circuit, an inverter circuit and an output circuit. The input circuit, the inverter circuit and the output circuit are coupled to a pull-up node, and the output circuit and the inverter circuit are coupled to a pull-down node. The input circuit is configured to control a voltage at the pull-up node in response to an input signal, the inverter circuit is configured to invert the voltage at the pull-up node and output the inverted voltage to the pull-down node, and the output circuit is configured to output a multi-pulse signal within a duration of one frame under the control of the voltage at the pull-up node and the voltage at the pull-down node.

Figure 4:
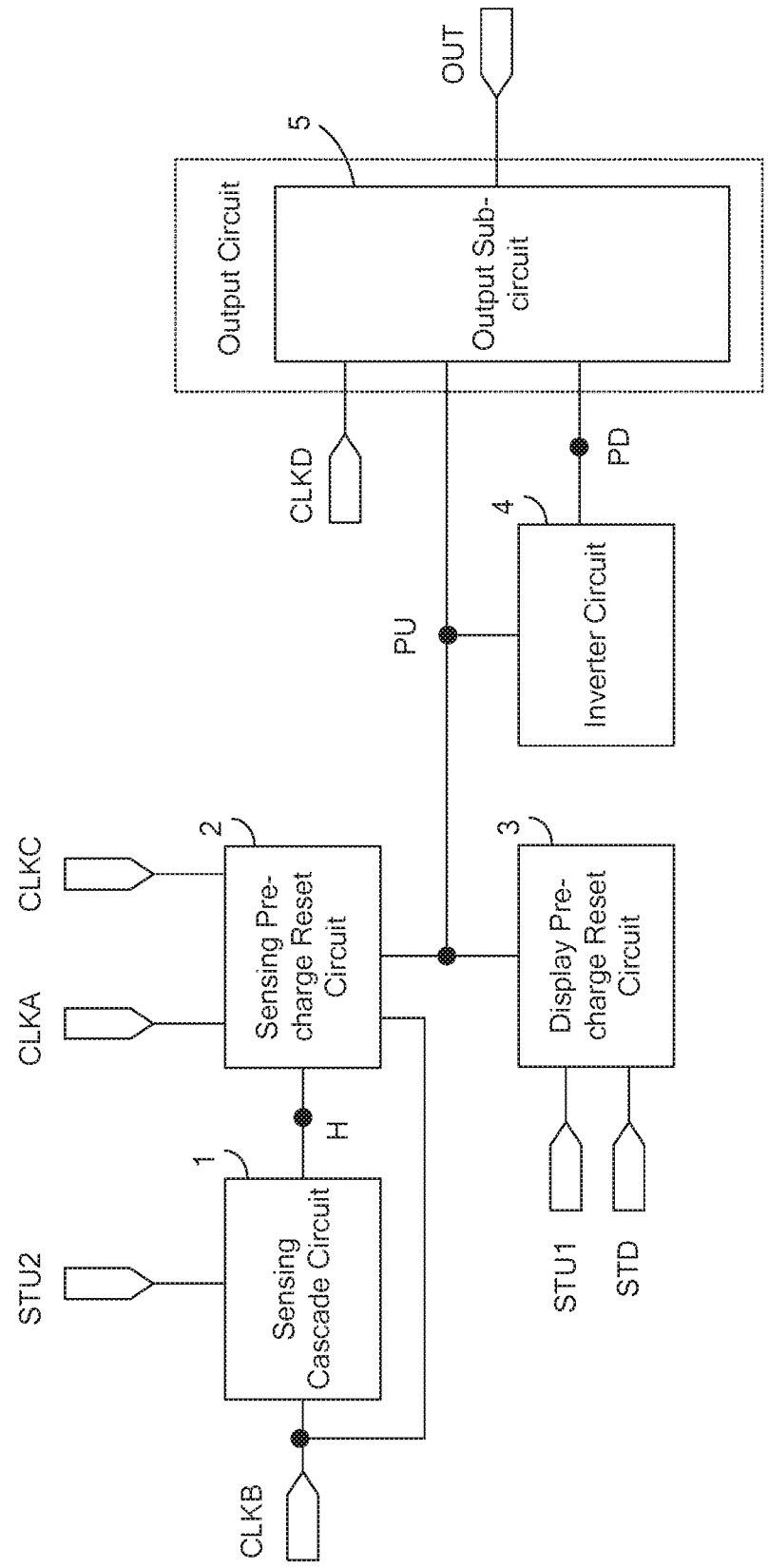
FIG. 4 is a schematic circuit diagram of a shift register according to some embodiments of the present disclosure.

FIG. 4 is a schematic circuit diagram of a shift register according to some embodiments of the present disclosure. As shown in FIG. 4, in some embodiments, the shift register includes: an input circuit (which includes a display pre-charge reset circuit 3, a sensing cascade circuit 1 and a sensing pre-charge reset circuit 2), an inverter circuit 4 and an output circuit. The sensing cascade circuit 1 and the sensing pre-charge reset circuit 2 are coupled to a sensing cascade node H, the display pre-charge reset circuit 3, the sensing pre-charge reset circuit 2 and the output circuit are coupled to a pull-up node PU, and the inverter circuit 4 and the output circuit are coupled to a pull-down node PD.

In an embodiment, the display pre-charge reset circuit 3 is coupled to a first signal input terminal STU1, a reset signal terminal STD, a first power supply terminal and a second power supply terminal, and is configured to write a first operating voltage in an active level state provided by the first power supply terminal to the pull-up node PU in response to the control of a first input signal provided by the first signal input terminal STU1 in a display pre-charge period, and to write a second operating voltage in an inactive level state provided by the second power supply terminal to the pull-up node PU in response to the control of a reset signal provided by the reset signal terminal STD in a display reset period.

In an embodiment, the sensing cascade circuit 1 is coupled to a second signal input terminal STU2 and a second clock signal terminal CLKB, and is configured to write a second input signal in an active level state provided by the second signal input terminal STU2 to the sensing cascade node H in response to the control of a second clock signal provided by the second clock signal terminal CLKB in a sensing cascade period.

In an embodiment, the sensing pre-charge reset circuit 2 is coupled to a first clock signal terminal CLKA, the second clock signal terminal CLKB, a third clock signal terminal CLKC and the second power supply terminal, and is configured to write a third clock signal in an active level state provided by the third clock signal terminal CLKC to the pull-up node PU in response to the control of a voltage at the sensing cascade node H and a first clock signal provided by the first clock signal terminal CLKA in a sensing pre-charge period, and to write the second operating voltage in an inactive level state provided by the second power supply terminal to the pull-up node PU in response to the control of the second clock signal provided by the second clock signal terminal CLKB in a sensing reset period.

In an embodiment, the inverter circuit 4 is configured to invert the voltage at the pull-up node PU and output the inverted voltage to the pull-down node PD.

In an embodiment, the output circuit is coupled to at least one signal output terminal OUT, and includes at least one output sub-circuit 5 in one-to-one correspondence with the at least one signal output terminal OUT. The output sub-circuit 5 is coupled to the pull-up node PU, the pull-down node PD, a corresponding signal output terminal OUT, a corresponding driving clock signal terminal CLKD and a corresponding reset power supply terminal, and the output sub-circuit 5 is configured to write a driving clock signal provided by the corresponding driving clock signal terminal CLKD to the corresponding signal output terminal OUT in response to the control of the voltage in an active level state at the pull-up node PU in a display output period and a sensing output period, and to write a reset operating voltage in an inactive level state provided by the corresponding reset power supply terminal to the corresponding signal output terminal OUT in response to the control of the voltage in an active level state at the pull-down node PD in the display reset period and the sensing reset period.

In some embodiments, the number of the at least one signal output terminal OUT is 1 to 4. It should be noted that FIG. 4 only exemplarily illustrates one signal output terminal OUT, and this does not limit the technical solution of the present disclosure.

As can be seen from the foregoing, in the present disclosure, the display pre-charge reset circuit 3 and the sensing pre-charge reset circuit 2 may share one inverter circuit 4 and one output circuit.

In the related art, the first shift register, which is configured to output a driving signal for driving the display switching transistor in the display driving period, at least includes one display pre-charge reset circuit 3, one inverter circuit 4 and one output circuit; and the second shift register, which is configured to output a driving signal for driving the sensing switching transistor in the sensing period, at least includes one sensing cascade circuit 1, one sensing pre-charge reset circuit 2, one inverter circuit 4 and one output circuit. It can be seen that the existing gate driving sub-circuit at least includes one display pre-charge reset circuit 3, one sensing cascade circuit 1, one sensing pre-charge reset circuit 2, two inverter circuits 4, two output circuits and one signal combining circuit.

In the present disclosure, the shift register provided by the present disclosure may independently constitute one gate driving sub-circuit, and thus the gate driving sub-circuit in the present disclosure includes one display pre-charge reset circuit 3, one sensing cascade circuit 1, one sensing pre-charge reset circuit 2, one inverter circuit 4 and one output circuit. Therefore, compared with the existing gate driving sub-circuit, the technical solution of the present disclosure can omit one inverter circuit 4 and one output circuit by sharing the inverter circuit 4 and the output circuit; meanwhile, the shift register provided by the present disclosure does not need to be provided with a signal combining circuit.

Therefore, compared with the gate driving sub-circuit provided by the related art, the gate driving sub-circuit constituted by the shift register provided by the present disclosure can omit one inverter circuit 4, one output circuit and one signal combining circuit, so that the technical solution of the present disclosure can reduce the number of TFTs in the gate driving sub-circuit, which is beneficial to the narrow-bezel implementation.

Figure 5:
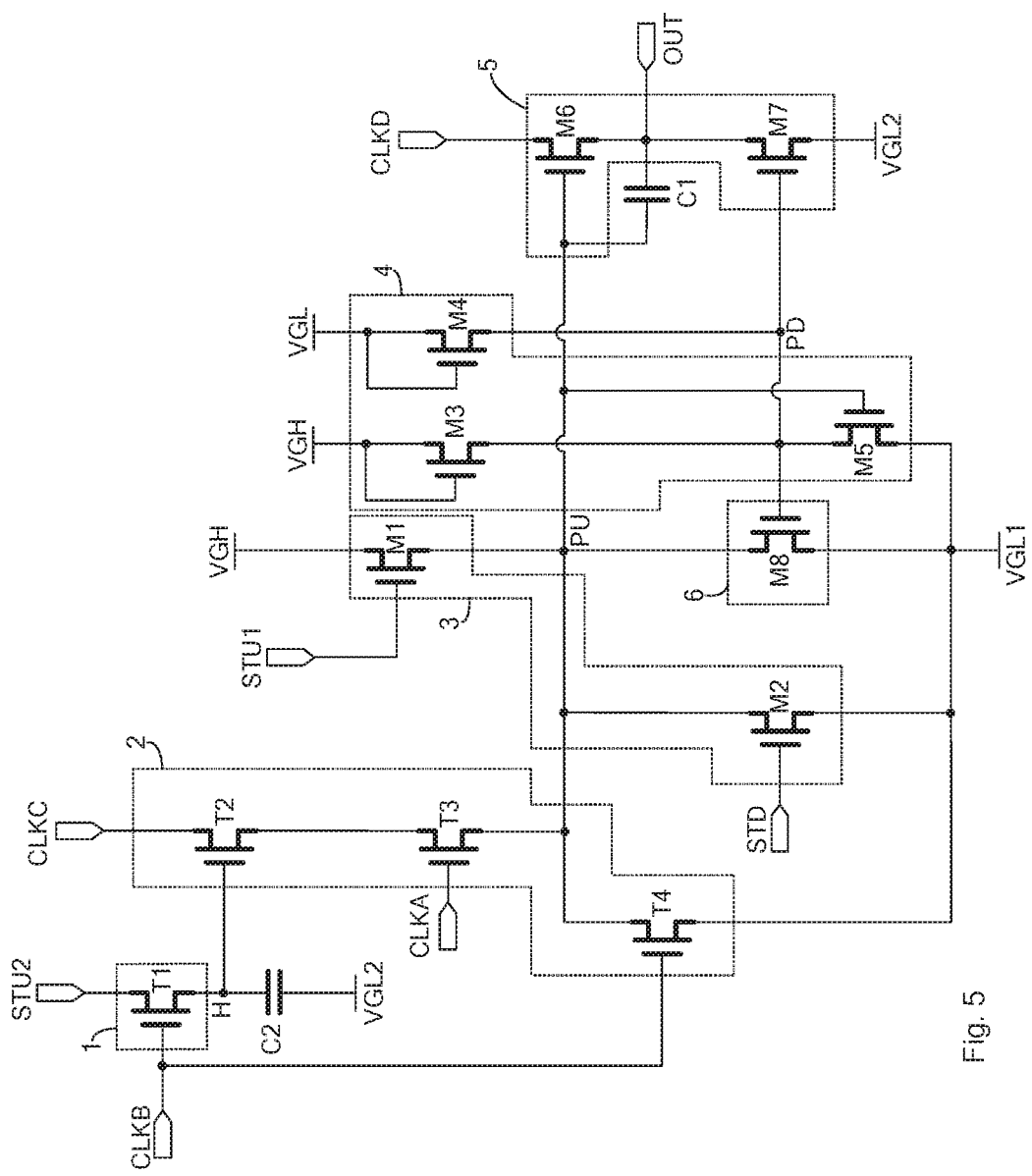
FIG. 5 is a schematic circuit diagram of another shift register according to some embodiments of the present disclosure.

FIG. 5 is a schematic circuit diagram of another shift register according to some embodiments of the present disclosure. The shift register shown in FIG. 5 is a specific configuration of a shift register based on the shift register shown in FIG. 4.

In some embodiments, the display pre-charge reset circuit 3 includes a first display transistor M1 and a second display transistor M2.

A control electrode of the first display transistor M1 is coupled to a first signal input terminal STU1, a first electrode of the first display transistor M1 is coupled to a first power supply terminal, and a second electrode of the first display transistor M1 is coupled to a pull-up node PU; a control electrode of the second display transistor M2 is coupled to a reset signal terminal STD, a first electrode of the second display transistor M2 is coupled to the pull-up node PU, and a second electrode of the second display transistor M2 is coupled to a second power supply terminal.

In some embodiments, the inverter circuit 4 includes a third display transistor M3, a fourth display transistor M4, and a fifth display transistor M5.

A control electrode of the third display transistor M3 is coupled to a third power supply terminal, a first electrode of the third display transistor M3 is coupled to the third power supply terminal, and a second electrode of the third display transistor M3 is coupled to a pull-down node PD.

A control electrode of the fourth display transistor M4 is coupled to a fourth power supply terminal, a first electrode of the fourth display transistor M4 is coupled to the fourth power supply terminal, and a second electrode of the fourth display transistor M4 is coupled to the pull-down node PD.

A control electrode of the fifth display transistor M5 is coupled to the pull-up node PU, a first electrode of the fifth display transistor M5 is coupled to the pull-down node PD, and a second electrode of the fifth display transistor M5 is coupled to the second power supply terminal.

Figure 6:
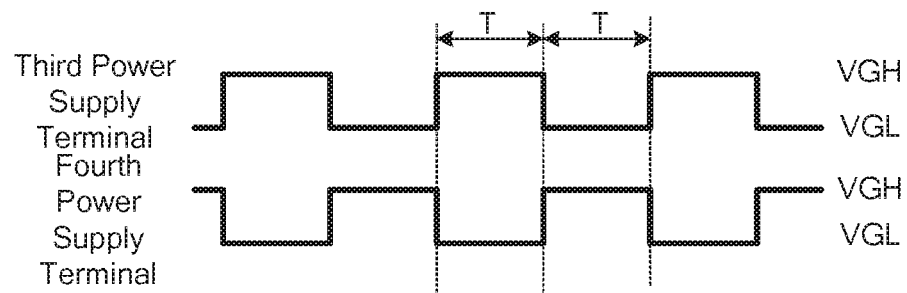
FIG. 6 is a timing diagram of a third operating voltage provided by a third power supply terminal and a fourth operating voltage provided by a fourth power supply terminal according to some embodiments of the present disclosure.

FIG. 6 is a timing diagram of a third operating voltage and a fourth operating voltage according to some embodiments of the present disclosure. As shown in FIG. 6, in the present disclosure, the third power supply terminal supplies the third operating voltage, the fourth power supply terminal supplies the fourth operating voltage, both the third operating voltage and the fourth operating voltage are switched once every preset period T between the active level state and the inactive level state, and one of the third operating voltage and the fourth operating voltage is in the active level state while the other is in the inactive level state at any time.

In an embodiment, the preset period T is in the range of 1 second (s) to 3 s. However, the present disclosure is not limited thereto, and the value of the preset period T may be designed and adjusted according to actual needs.

As is apparent from the above description, the inverter circuit 4 includes the third display transistor M3, the fourth display transistor M4, and the fifth display transistor M5, and the third operating voltage and the fourth operating voltage are switched between the active level state and the inactive level state once every preset period T. Since the third operating voltage and the fourth operating voltage are switched between the active level state and the inactive level state at intervals, the first electrodes of the third display transistor M3 and the fourth display transistor M4 are not always in a constant voltage state, so that the threshold voltages of the third display transistor M3 and the fourth display transistor M4 can be effectively prevented from being shifted due to the constant voltage, which in turn ensure the stability of the electrical characteristics of the third display transistor M3 and the fourth display transistor M4.

In the present disclosure, the inverter circuit 4 may also adopt other circuit structures capable of inverting a voltage signal by 180°, and specific cases are not illustrated here.

In an embodiment, the output sub-circuit 5 includes a sixth display transistor M6 and a seventh display transistor M7.

A control electrode of the sixth display transistor M6 is coupled to the pull-up node PU, a first electrode of the sixth display transistor M6 is coupled to a driving clock signal terminal CLKD, and a second electrode of the sixth display transistor M6 is coupled to a signal output terminal OUT.

A control electrode of the seventh display transistor M7 is coupled to the pull-down node PD, a first electrode of the seventh display transistor M7 is coupled to the corresponding signal output terminal OUT, and a second electrode of the seventh display transistor M7 is coupled to a reset power supply terminal.

In some embodiments, the shift register further includes a first capacitor C1 having a first terminal coupled to the pull-up node PU and a second terminal coupled to the signal output terminal OUT. The first capacitor C1 may be configured to ensure that the voltage at the pull-up node PU is always in an active level state in the display output period and the sensing output period.

In some embodiments, the sensing cascade circuit 1 includes a first sensing transistor T1 having a control electrode coupled to a second clock signal terminal CLKB, a first electrode coupled to a second signal input terminal STU2, and a second electrode coupled to a sensing cascade node H.

In some embodiments, the shift register further includes a second capacitor C2 having a first terminal coupled to the sensing cascade node H and a second terminal coupled to a fifth power supply terminal. The second capacitor C2 is configured to keep the voltage at the sensing cascade node H stable when the first sensing transistor T1 is in an off state.

In some embodiments, the sensing pre-charge reset circuit 2 includes a second sensing transistor T2, a third sensing transistor T3, and a fourth sensing transistor T4.

A control electrode of the second sensing transistor T2 is coupled to the sensing cascade node H, a first electrode of the second sensing transistor T2 is coupled to a third clock signal terminal CLKC, and a second electrode of the second sensing transistor T2 is coupled to a first electrode of the third sensing transistor T3.

A control electrode of the third sensing transistor T3 is coupled to a first clock signal terminal CLKA, and a second electrode of the third sensing transistor T3 is coupled to the pull-up node PU.

A control electrode of the fourth sensing transistor T4 is coupled to the second clock signal terminal CLKB, a first electrode of the fourth sensing transistor T4 is coupled to the pull-up node PU, and a second electrode of the fourth sensing transistor T4 is coupled to the second power supply terminal.

Next, the operation of the shift register shown in FIG. 5 will be described in detail with reference to the drawings. It is assumed that the first operating voltage provided by the first power supply terminal is a high-level operating voltage VGH, the second operating voltage provided by the second power supply terminal is a low-level operating voltage VGL1, the third operating voltage provided by the third power supply terminal is the high-level operating voltage VGH, the fourth operating voltage provided by the fourth power supply terminal is a low-level operating voltage VGL, the fifth operating voltage provided by the fifth power supply terminal is a low-level operating voltage VGL2, and the reset operating voltage provided by the reset power supply terminal is the low-level operating voltage VGL2.

Figure 7:
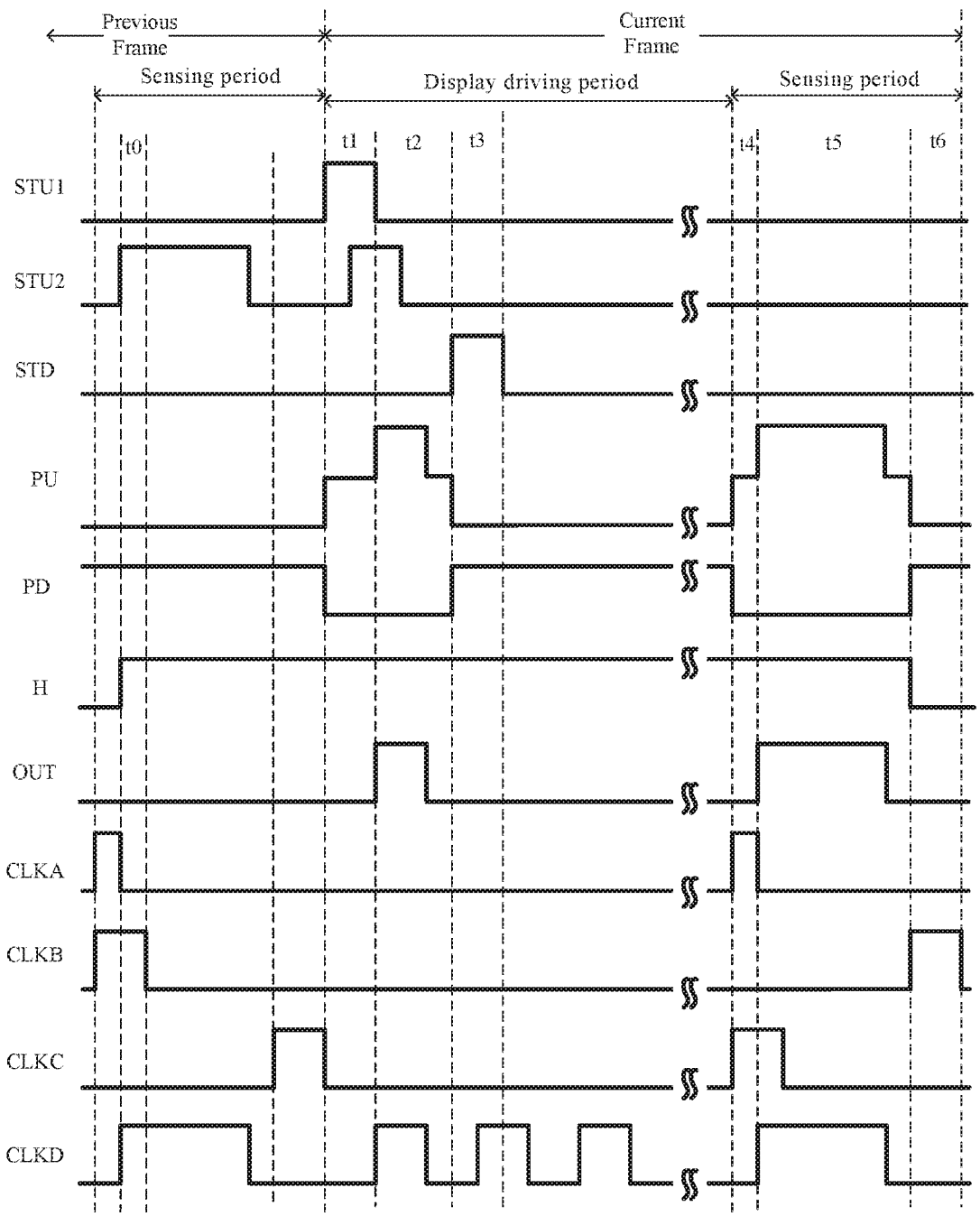
FIG. 7 is a timing diagram illustrating the operation of the shift register shown in FIG. 5.

FIG. 7 is a timing diagram illustrating operation of the shift register shown in FIG. 5. The operation of the shift register shown in FIG. 5 will be described in detail with reference to FIG. 7. As shown in FIG. 7, the operation of the shift register includes the following seven periods t0 to t6.

In the sensing cascade period t0 (in the sensing period of the previous flame), the first input signal provided by the first signal input terminal STU1 is in a low level state, the second input signal provided by the second signal input terminal STU2 is in a high level state, the reset signal provided by the reset signal terminal STD is in a low level state, the first clock signal provided by the first clock signal terminal CLKA is in a low level state, the second clock signal provided by the second clock signal terminal CLKB is in a high level state, the third clock signal provided by the third clock signal terminal CLKC is in a low level state, and the driving clock signal provided by the driving clock signal terminal CLKD is in a high level state.

Since the second clock signal is in a high level state, the first sensing transistor T1 and the fourth sensing transistor are turned on, at this time, the second input signal in a high level state is written to the sensing cascade node H through the first sensing transistor T1, the voltage at the sensing cascade node H is in a high level state, the second sensing transistor T2 is turned on, and the third clock signal may be written to the first electrode of the third sensing transistor T3 through the second sensing transistor T2. Since the first clock signal is in a low level state, the third sensing transistor T3 is turned off, and the third clock signal cannot be written to the pull-up node PU. Also, since the fourth sensing transistor T4 is turned on, the second operating voltage VGL1 is written to the pull-up node PU through the fourth sensing transistor T4.

Since both the first input signal and the reset signal are in a low level state, both the first display transistor M1 and the second display transistor M2 are turned off.

Since the voltage at the pull-up node PU is in a low level state, both the fifth display transistor M5 and the sixth display transistor M6 are turned off; in the inverter circuit 4, the third operating voltage VGH is written to the pull-down node PD through the third display transistor M3, the voltage at the pull-down node PD is in a high level state, at this time, the seventh display transistor M7 is turned on, and the reset operating voltage VGL2 is written to the signal output terminal OUT through the seventh display transistor M7, that is, the signal output terminal OUT outputs a low-level signal.

In the pre-charge period t1, the first input signal provided by the first signal input terminal STU1 is in a high level state, the second input signal provided by the second signal input terminal STU2 is in a low level state and is switched to a high level state after a period of time, the reset signal provided by the reset signal terminal STD is in a low level state, the first clock signal provided by the first clock signal terminal CLKA is in a low level state, the second clock signal provided by the second clock signal terminal CLKB is in a low level state, the third clock signal provided by the third clock signal terminal CLKC is in a low level state, and the driving clock signal provided by the driving clock signal terminal CLKD is in a low level state.

Since the second clock signal is in a low level state, both the first sensing transistor T1 and the fourth sensing transistor T4 are turned off, the sensing cascade node H is in a floating state, and the voltage at the sensing cascade node H maintains a high level state of the previous period. It should be noted that, since the first sensing transistor T1 is turned off, the voltage at the sensing cascade node H will not be affected by the second input signal regardless of whether the second input signal is in al high level state or a low level state.

Further, the second capacitor C2 in the present disclosure can keep the voltage at the sensing cascade node H stable after the sensing cascade period to ends and when the sensing cascade node H is in a floating state. Since the first clock signal is still in a low level state, the third sensing transistor T3 remains turned off.

Since the first input signal is in a high level state and the reset signal is in a low level state, the first display transistor M1 is turned on and the second display transistor M2 is turned off, the first operating voltage VGH may be written to the pull-up node PU through the first display transistor M1, and the voltage at the pull-up node PU is in a high level state.

Since the voltage at the pull-up node PU is in a high level state, the fifth display transistor M5 and the sixth display transistor M6 are turned on, the second operating voltage VGL1 is written to the pull-down node PD through the fifth display transistor M5, at this time, the third display transistor M3 is equivalent to a resistor, the voltage at the pull-down node PD is in a low level state, and the seventh display transistor M7 is turned off. Meanwhile, the driving clock signal is written to the corresponding signal output terminal OUT through the sixth display transistor M6, and the signal output terminal OUT outputs a low-level signal because the driving clock signal is in a low level state.

In the display output period t2, the first input signal provided by the first signal input terminal STU1 is in a low level state, the second input signal provided by the second signal input terminal STU2 is in a high level state and is switched to a low level state after a period of time, the reset signal provided by the reset signal terminal STD is in a low level state, the first clock signal provided by the first clock signal terminal CLKA is in a low level state, the second clock signal provided by the second clock signal terminal CLKB is in a low level state, the third clock signal provided by the third clock signal terminal CLKC is in a low level state, and the driving clock signal provided by the driving clock signal terminal CLKD is in a high level state and is switched to a low level state after a period of time.

Since the second clock signal is in a low level state, the first sensing transistor T1 and the fourth sensing transistor T4 are both turned off, the sensing cascade node H is in a floating state, and the voltage at the sensing cascade node H maintains a high level state of the previous period (the second input signal does not affect the voltage at the sensing cascade node H). Since the first clock signal is still in a low level state, the third sensing transistor T3 remains turned off.

Since the first input signal and the reset signal are both in a low level state, the first display transistor M1 and the second display transistor M2 are both turned off, the pull-up node PU is in a floating state, and maintains a high level state of the previous period, at this time, the fifth display transistor M5 and the sixth display transistor M6 remain turned on, the pull-down node PD remains in a low level state (the seventh display transistor M7 is turned off), and the driving clock signal is written to the corresponding signal output terminal OUT through the sixth display transistor M6.

At the initial time of the display driving period t2, the driving clock signal is switched from a low level state to a high level state, and the signal output terminal OUT outputs a high-level signal. At the same time, the voltage at the pull-up node PU is pulled up to a higher level under the bootstrapping effect of the first capacitor C1. In this embodiment, assuming that the voltage corresponding to each clock signal is VGH when it is in the high level state and VGL (approximately 0V) when it is in the low level state, the voltage at the pull-up node PU is approximately VGH in the display pre-charge period t1, and the voltage at the pull-up node PU may be pulled up to approximately 2×VGH at the initial time of the display driving period t2. After a period of time, the driving clock signal is switched from a high level state to a low level state, and then the signal output terminal OUT outputs a low-level signal; meanwhile, under the bootstrapping effect of the first capacitor C1, the voltage at the pull-up node PU drops to the level at the initial time of the display driving period t2, i.e., to VGH, and the pull-up node PU is still in a high level state.

In the reset period t3, the first input signal provided by the first signal input terminal STU1 is in a low level state, the second input signal provided by the second signal input terminal STU2 is in a low level state, the reset signal provided by the reset signal terminal STD is in a high level state, the first clock signal provided by the first clock signal terminal CLKA is in a low level state, the second clock signal provided by the second clock signal terminal CLKB is in a low level state, the third clock signal provided by the third clock signal terminal CLKC is in a low level state, and the driving clock signal provided by the driving clock signal terminal CLKD is in a low level state and is switched to a high level state after a period of time.

Since the second clock signal is in a low level state, the first sensing transistor T1 and the fourth sensing transistor T4 are both turned off, the sensing cascade node H is in a floating state, and the voltage at the sensing cascade node H maintains a high level state of the previous period. Since the first clock signal is still in a low level state, the third sensing transistor T3 remains turned off.

Since the first input signal is in a low level state and the reset signal is in a high level state, the first display transistor M1 is turned off and the second display transistor M2 is turned on, the second operating voltage VGL1 may be written to the pull-up node PU through the second display transistor M2, and the voltage at the pull-up node PU is in a low level state.

Since the voltage at the pull-up node PU is in a low level state, both the fifth display transistor M5 and the sixth display transistor M6 are turned off. Since the sixth display transistor M6 is turned off, the driving clock signal cannot be written to the signal output terminal OUT, and thus has no effect on the voltage at the signal output terminal OUT. In the inverter circuit 4, the third operating voltage VGH is written to the pull-down node PD through the third display transistor M3, the voltage at the pull-down node PD is in a high level state, at this time, the seventh display transistor M7 is turned on, and the reset operating voltage VGL2 is written to the signal output terminal OUT through the seventh display transistor M7, that is, the signal output terminal OUT outputs a low-level signal.

In the sensing pre-charge period t4, the first input signal provided by the first signal input terminal STU1 is in a low level state, the second input signal provided by the second signal input terminal STU2 is in a low level state, the reset signal provided by the reset signal terminal STD is in a low level state, the first clock signal provided by the first clock signal terminal CLKA is in a high level state, the second clock signal provided by the second clock signal terminal CLKB is in a low level state, the third clock signal provided by the third clock signal terminal CLKC is in a high level state, and the driving clock signal provided by the driving clock signal terminal CLKD is in a low level state.

Since the second clock signal is in a low level state, the first sensing transistor T1 and the fourth sensing transistor T4 are both turned off, the sensing cascade node H is in a floating state, the voltage at the sensing cascade node H maintains a high level state of the previous period, and accordingly the second sensing transistor T2 maintains a turned-on state. Meanwhile, since the first clock signal is still in a high level state, the third sensing transistor T3 is turned on, the third clock signal in a high level state is written to the pull-up node PU sequentially through the second sensing transistor T2 and the third sensing transistor T3, and the voltage at the pull-up node PU is in a high level state.

Since the first input signal is in a low level state and the reset signal is in a low level state, both the first display transistor M1 and the second display transistor M2 are turned off.

Since the voltage at the pull-up node PU is in a high level state, the fifth display transistor M5 and the sixth display transistor M6 are turned on, the second operating voltage VGL1 is written to the pull-down node PD through the fifth display transistor M5, at this time, the third display transistor M3 is equivalent to a resistor, the voltage at the pull-down node PD is in a low level state, and the seventh display transistor M7 is turned off. Meanwhile, the driving clock signal is written to the corresponding signal output terminal OUT through the sixth display transistor M6, and since the driving clock signal is in a low level state, the signal output terminal OUT outputs a low-level signal.

In the sensing output period t5, the first input signal provided by the first signal input terminal STU1 is in a low level state, the second input signal provided by the second signal input terminal STU2 is in a low level state, the reset signal provided by the reset signal terminal STD is in a low level state, the first clock signal provided by the first clock signal terminal CLKA is in a low level state, the second clock signal provided by the second clock signal terminal CLKB is in a low level state, the third clock signal provided by the third clock signal terminal CLKC is in a high level state firstly and is switched to a low level state after a period of time, and the driving clock signal provided by the driving clock signal terminal CLKD is in a high level state and is in a low level state after a period of time.

Since the second clock signal is in a low level state, the first sensing transistor T1 and the fourth sensing transistor T4 are both turned off, the voltage at the sensing cascade node H maintains a high level state of the previous period, and the second sensing transistor T2 remains turned on. Since the first clock signal is in a low level state, the third sensing transistor T3 is turned off, and the third clock signal does not affect the voltage at the pull-up node PU.

Since the first input signal and the reset signal are both in a low level state, the first display transistor M1 and the second display transistor M2 are both turned off, the pull-up node PU is in a floating state, and maintains a high level state of the previous period, at this time, the fifth display transistor M5 and the sixth display transistor M6 remain turned on, the pull-down node PD maintains a low level state (the seventh display transistor M7 is turned off), and the driving clock signal is written to the corresponding signal output terminal OUT through the sixth display transistor M6.

At the initial time of the sensing driving period t5, the driving clock signal is switched from a low level state to a high level state, and the signal output terminal OUT outputs a high-level signal. At the same time, the voltage at the pull-up node PU is pulled up to a higher level under the bootstrapping effect of the first capacitor C1. In this embodiment, assuming that the voltage corresponding to each clock signal is VGH when it is in a high level and VGL (approximately 0V) when it is in a low level, the voltage at the pull-up node PU is approximately VGH in the sensing pre-charge period t4, and the voltage at the pull-up node PU may be pulled up to approximately 2×VGH at the initial time of the sensing driving period t5. After a period of time, the driving clock signal is switched from a high level state to a low level state, and then the signal output terminal OUT outputs a low-level signal; meanwhile, under the bootstrapping effect of the first capacitor C1, the voltage at the pull-up node PU drops to the level at the initial time of the sensing driving period t5, i.e., to VGH, and the pull-up node PU is still in a high level state.

In the sensing reset period t6, the first input signal provided by the first signal input terminal STU1 is in a low level state, the second input signal provided by the second signal input terminal STU2 is in a low level state, the reset signal provided by the reset signal terminal STD is in a low level state, the first clock signal provided by the first clock signal terminal CLKA is in a low level state, the second clock signal provided by the second clock signal terminal CLKB is in a high level state, the third clock signal provided by the third clock signal terminal CLKC is in a low level state, and the driving clock signal provided by the driving clock signal terminal CLKD is in a low level state.

Since the second clock signal is in a high level state, the first sensing transistor T1 and the fourth sensing transistor T4 are both turned on, the second input signal in a low level state is written to the sensing cascade node H through the first sensing transistor T1, the voltage at the sensing cascade node H is in a low level state, and the second sensing transistor T2 is turned off. Since the first clock signal is in a low level state, the third sensing transistor T3 is turned off.

Since the fourth sensing transistor M4 is turned on, the second operating voltage VGL1 is written to the pull-up node PU through the fourth display transistor M4, and the voltage at the pull-up node PU is in a low level state.

Since the first input signal is in a low level state and the reset signal is in a low level state, both the first display transistor M1 and the second display transistor M2 are turned off.

Since the voltage at the pull-up node PU is in a low level state, both the fifth display transistor M5 and the sixth display transistor M6 are turned off; in the inverter circuit 4, the third operating voltage VGH is written to the pull-down node PD through the third display transistor M3, the voltage at the pull-down node PD is in a high level state, at this time, the seventh display transistor M7 is turned on, and the reset operating voltage VGL2 is written to the signal output terminal OUT through the seventh display transistor M7, that is, the signal output terminal OUT outputs a low-level signal.

Therefore, the shift register can respectively output high-level (active level) signals in the display driving period and the sensing period of one frame to meet the driving requirements of a corresponding row of pixel units.

In some embodiments, as shown in FIG. 5, the shift register further includes a noise reduction circuit 6. The noise reduction circuit 6 is configured to reduce noise at the pull-up node PU when the voltage at the pull-up node PU is in an inactive level state so as to maintain the stability of the voltage at the pull-up node PU. In an embodiment, the noise reduction circuit 6 includes an eighth display transistor M8. A control electrode of the eighth display transistor M8 is coupled to the pull-down node PD, a first electrode of the eighth display transistor M8 is coupled to the pull-up node PU, and a second electrode of the eighth display transistor M8 is coupled to the second power supply terminal.

During a period from the end of the display reset period t3 to the beginning of the sensing pre-charge period t4, the voltage at the pull-up node PU needs to remain in a low level (inactive level) state. By providing the eighth display transistor M8, the inverter circuit 4 and the eighth display transistor M8 can form a positive feedback loop to strengthen the voltage at the pull-up node PU. For example, when the voltage at the pull-up node PU is in a low level state, the inverter circuit 4 controls the voltage at the pull-down node PD to be in a high level state, and at this time, the eighth display transistor M8 is turned on, and the second operating voltage VGL1 is written to the pull-up node PU through the eighth display transistor M8, so as to strengthen the voltage at the pull-up node PU to be in a low level state (the magnitude of the voltage is VGL1), thereby achieving the purpose of reducing noise.

In practical applications, it is found that when the shift register shown in FIG. 5 outputs an active level signal at the signal output terminal OUT in the display output period t2 and the sensing output period t5, the voltage at the pull-up node PU is pulled up to a higher level (about 2×VGH) by the first capacitor C1, and at this time, the source-drain voltages (about 2×VGH) of the second display transistor M2, the eighth display transistor M8, the third sensing transistor T3, and the fourth sensing transistor T4 are large, and these four transistors are likely to enter a saturated conduction state to generate a leakage current, so that the voltage at the pull-up node PU drifts, and the shift register operates abnormally.

Figure 8:
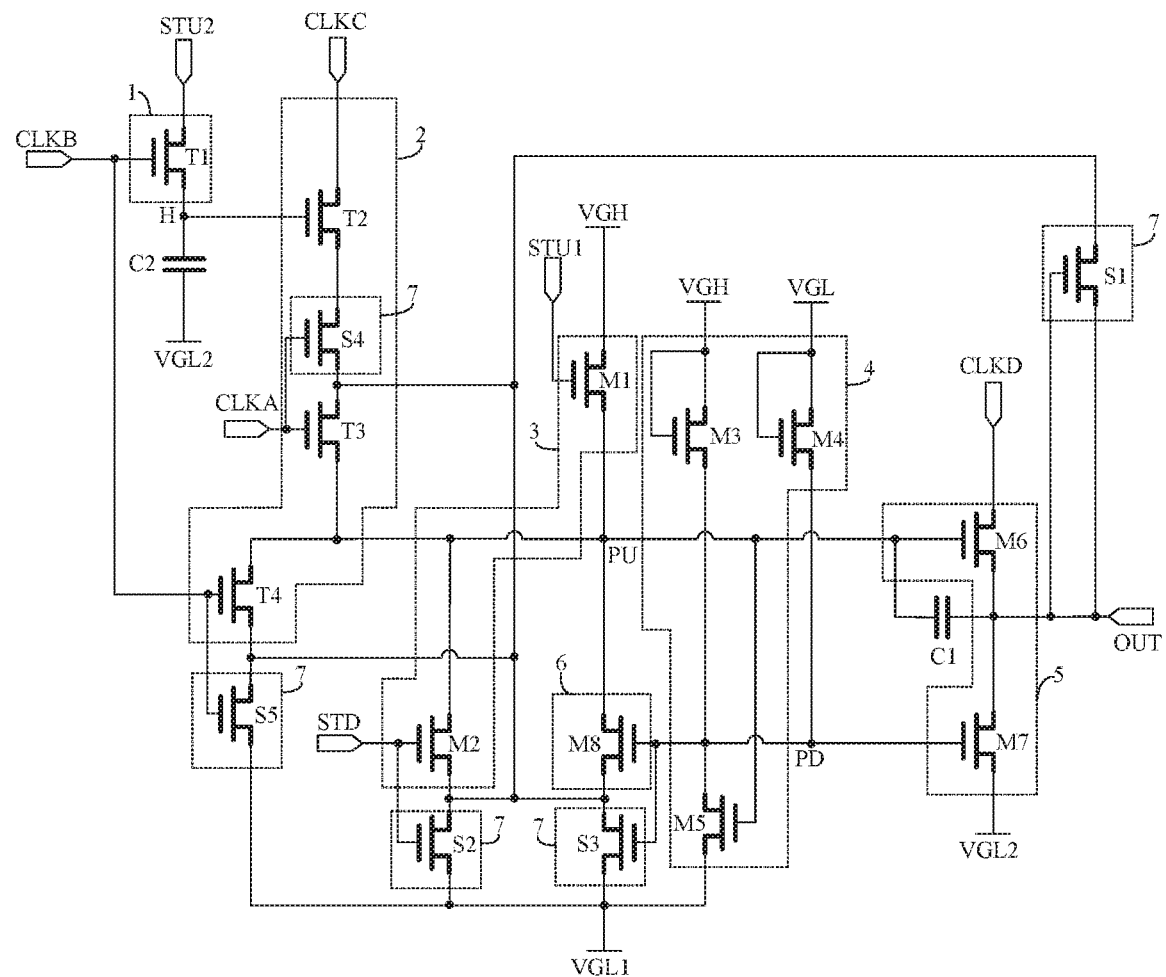
FIG. 8 is a schematic circuit diagram of another shift register according to some embodiments of the present disclosure.

The present disclosure further provides a shift register based on the shift register shown in FIG. 5. FIG. 8 is a schematic circuit diagram of another shift register according to some embodiments of the present disclosure. In some embodiments, compared to the shift register shown in FIG. 5, the shift register shown in FIG. 8 further includes an anti-leakage circuit 7. The anti-leakage circuit 7 can be used to prevent the second display transistor M2, the eighth display transistor M8, the third sensing transistor T3 and the fourth sensing transistor T4 from generating leakage currents in the display output period and the sensing output period.

In an embodiment, the anti-leakage circuit 7 includes a first anti-leakage transistor S1. In addition, in response to the leakage current problem at four locations of the second display transistor M2, the eighth display transistor M8, the third sensing transistor T3 and the fourth sensing transistor T4, a second anti-leakage transistor S2, a third anti-leakage transistor S3, a fourth anti-leakage transistor S4 and a fifth anti-leakage transistor S5 are correspondingly disposed in the anti-leakage circuit 7. The second electrode of the second display transistor M2 is coupled to the second power supply terminal through the second anti-leakage transistor S2, the second electrode of the eighth display transistor M8 is coupled to the second power supply terminal through the third anti-leakage transistor S3, the first electrode of the third sensing transistor T3 is coupled to the second electrode of the second sensing transistor T2 through the fourth anti-leakage transistor S4, and the second electrode of the fourth sensing transistor T4 is coupled to the second power supply terminal through the fifth anti-leakage transistor S5.

A control electrode of the first anti-leakage transistor S1 is coupled to one signal output terminal OUT, a second electrode of the first anti-leakage transistor S1 is coupled to one signal output terminal OUT, and a first electrode of the first anti-leakage transistor S1 is coupled to a first electrode of the second anti-leakage transistor S2, a first electrode of the third anti-leakage transistor S3, a second electrode of the fourth anti-leakage transistor S4, and a first electrode of the fifth anti-leakage transistor S5.

Figure 11:
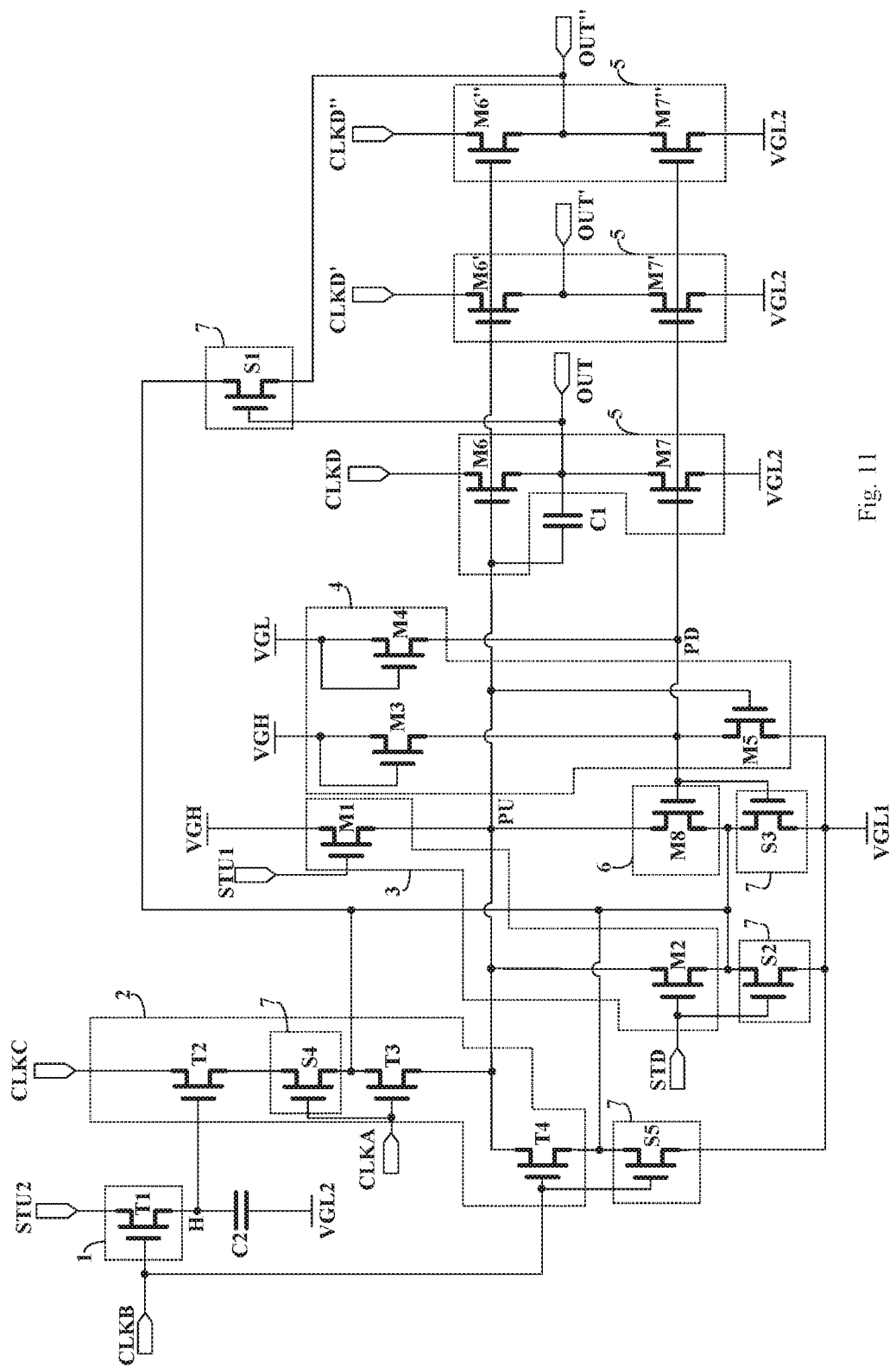
FIG. 11 is a schematic circuit diagram of another shift register according to some embodiments of the present disclosure.
Figure 12:
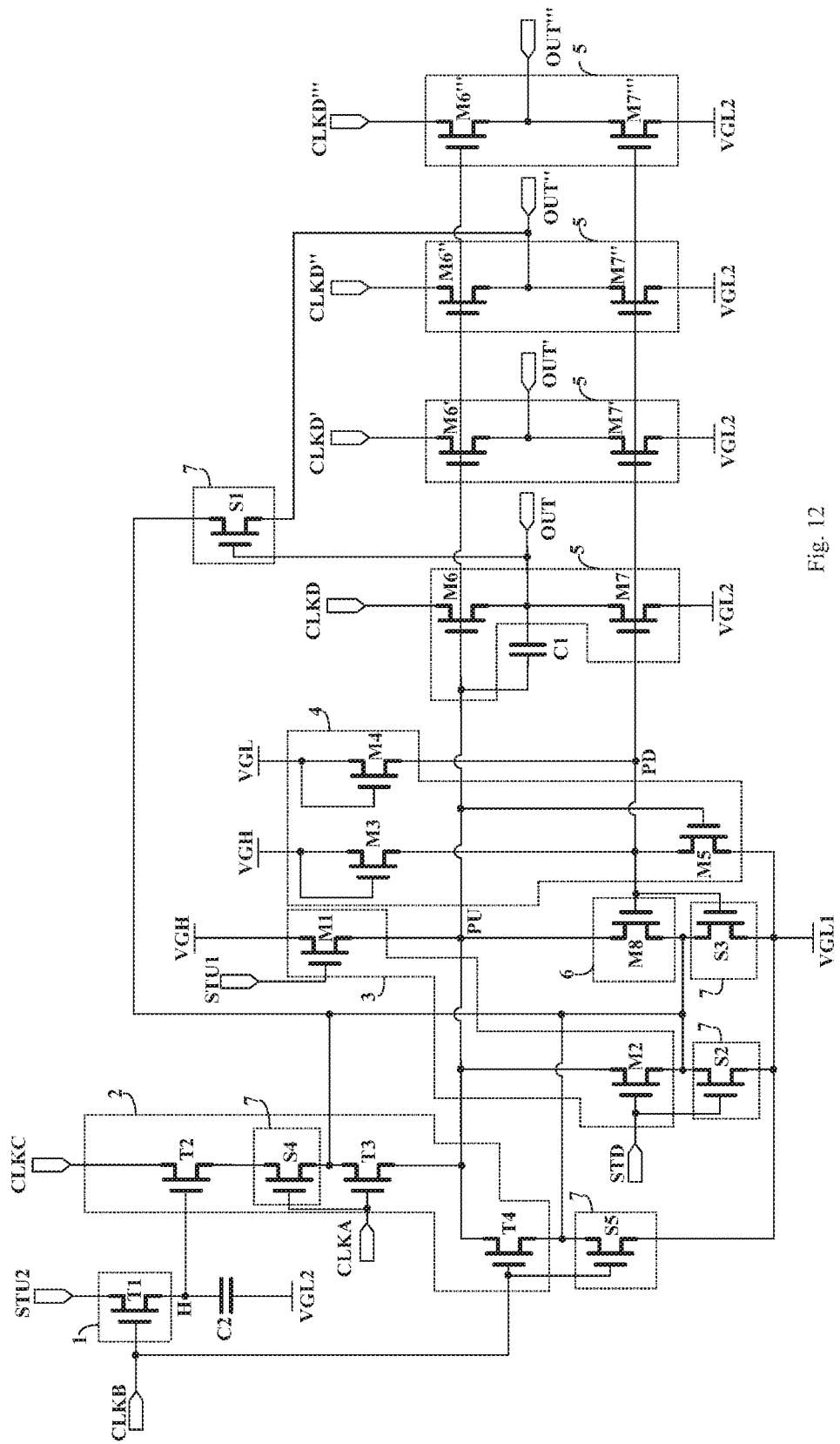
FIG. 12 is a schematic circuit diagram of another shift register according to some embodiments of the present disclosure.

It should be noted that, the case where the control electrode and the second electrode of the first anti-leakage transistor S1 are coupled to the same signal output terminal OUT is only exemplified in the figure, which does not limit the technical solution of the present disclosure, and it should be known to those skilled in the art that, when the number of the signal output terminals OUT is 2 or more, the control electrode and the second electrode of the first anti-leakage transistor S1 may be respectively coupled to different signal output terminals OUT (for example, as shown in FIGS. 11 and 12).

A control electrode of the second anti-leakage transistor S2 is coupled to the control electrode of the second display transistor M2, the first electrode of the second anti-leakage transistor S2 is coupled to the second electrode of the second display transistor M2, and a second electrode of the second anti-leakage transistor S2 is coupled to the second power supply terminal.

A control electrode of the third anti-leakage transistor S3 is coupled to the control electrode of the eighth display transistor M8, the first electrode of the third anti-leakage transistor S3 is coupled to the second electrode of the eighth display transistor M8, and a second electrode of the third anti-leakage transistor S3 is coupled to the second power supply terminal.

A control electrode of the fourth anti-leakage transistor S4 is coupled to the control electrode of the third sensing transistor T3, a first electrode of the fourth anti-leakage transistor S4 is coupled to the second electrode of the second sensing transistor T2, and the second electrode of the fourth anti-leakage transistor S4 is coupled to the first electrode of the third sensing transistor T3.

A control electrode of the fifth anti-leakage transistor S5 is coupled to the control electrode of the fourth sensing transistor T4, the first electrode of the fifth anti-leakage transistor S5 is coupled to the second electrode of the fourth sensing transistor T4, and a second electrode of the fifth anti-leakage transistor S5 is coupled to the second power supply terminal.

The operation process of the shift register shown in FIG. 8 may refer to the contents described with reference to FIGS. 5 and 6, and details thereof are not repeated here. Only the operation process of each transistor in the anti-leakage circuit 7 is described in detail below.

In the sensing cascade period, the display pre-charge period, the display reset period, the sensing pre-charge period and the sensing reset period, the first anti-leakage transistor S1 is in a turned-off state due to the low-level signal output by the signal output terminal OUT.

When the signal output terminal OUT outputs a high-level signal in the sensing output period and the display output period, the high-level signal is output to the control electrode of the first anti-leakage transistor S1. The first anti-leakage transistor S1 is turned on, and at this time, the high-level signal (voltage VGH) output by the signal output terminal OUT coupled to the second electrode of the first anti-leakage transistor S1 is written to the first electrode of the second anti-leakage transistor S2, (the second electrode of the second display transistor M2), the first electrode of the third anti-leakage transistor S3 (the second electrode of the eighth display transistor M8), the second electrode of the fourth anti-leakage transistor S4 (the first electrode of the third sensing transistor T3), and the first electrode of the fifth anti-leakage transistor S5 (the second electrode of the fourth sensing transistor T4) through the first anti-leakage transistor S1. At this time, the source-drain voltages of the second display transistor M2, the eighth display transistor M8, the third sensing transistor T3 and the fourth sensing transistor T4 are relatively small (about VGH), so that the foregoing four transistors are prevented from being in a saturated conduction state, which in turn prevents the generation of leakage current, and ensures stability of the voltage at the pull-up node PU.

Figure 9:
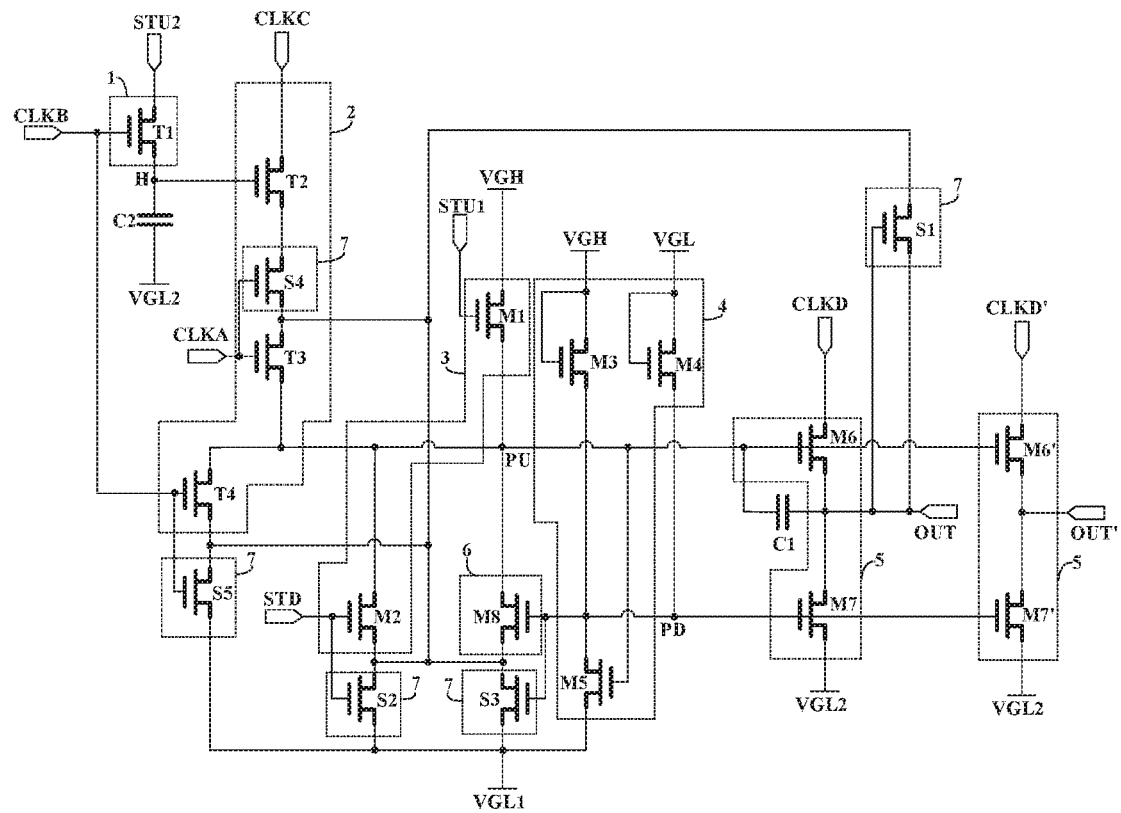
FIG. 9 is a schematic circuit diagram of another shift register according to some embodiments of the present disclosure.

FIG. 9 is a schematic circuit diagram of another shift register according to some embodiments of the present disclosure. Compared with the shift register described above, as shown in FIG. 9, in some embodiments, the number of signal output terminals is two (OUT/OUT'), and accordingly, the number of output sub-circuits 5 is two. The sixth display transistors M6/M6' in the output sub-circuits 5 are turned on or off at the same time, and the seventh display transistors M7/M7' in the output sub-circuits 5 are turned on or off at the same time.

The driving clock signals provided by the driving clock signal terminals CLKD/CLKD' to which the two output sub-circuits 5 are respectively coupled may be the same or different.

In some embodiments, the driving clock signals provided by the driving clock signal terminals CLKD/CLKD' to which the two output sub-circuits 5 are respectively coupled are the same, and in this case, one of the two signal output terminals OUT/OUT is configured to provide a cascade signal to other shift register in the gate driving circuit (see the following description), and the other is configured to provide a driving signal to the gate line G2 to which the control electrode of the sensing switching transistor STFT in the corresponding row of pixel units is coupled.

In the above solution, the signal output terminal for providing the cascade signal is separated from the signal output terminal for providing the driving signal, so that the load on the signal output terminal for providing the driving signal can be reduced, and the stability of the driving signal output by the shift register to the gate line in the corresponding row can be ensured.

Figure 10:
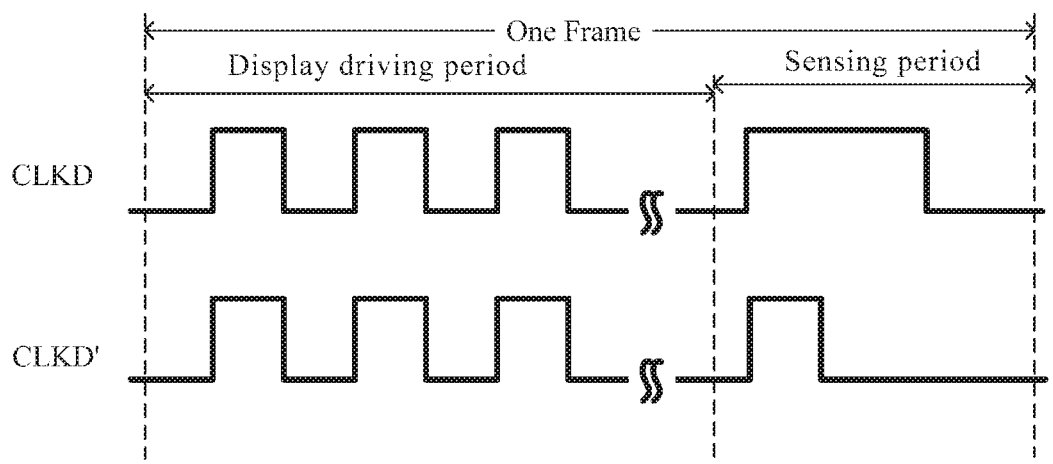
FIG. 10 is a timing diagram illustrating a case where the two driving clock signal terminals in FIG. 9 provide different clock signals.

In some embodiments, the driving clock signal terminals CLKD/CLKD' to which the two output sub-circuits 5 are respectively coupled provide different driving clock signals. FIG. 10 is a timing diagram illustrating a case where the two driving clock signal terminals in FIG. 9 provide different clock signals. As shown in FIG. 10, the two driving clock signal terminals CLKD/CLKD' provide the same driving clock signal in the display driving period, but provide different driving clock signals in the sensing period. The driving clock signal provided by the driving clock signal terminal CLKD corresponds to the driving signal required by the gate line G2 coupled to the control electrode of the sensing switching transistor STFT in the pixel unit, and the driving clock signal provided by the driving clock signal terminal CLKD corresponds to the driving signal required by the gate line G1 coupled to the control electrode of the display switching transistor QTFT.

In this case, one of the two signal output terminals OUT/OUT' (signal output terminal OUT in FIG. 9) is configured to provide a cascade signal to other shift register in the gate driving circuit and simultaneously provide a driving signal to the gate line G2 to which the control electrodes of the sensing switching transistors STFT in the corresponding row of pixel units are coupled, and the other (signal output terminal OUT' in FIG. 9) is configured to provide a driving signal to the gate line G1 to which the control electrodes of the display switching transistors QTFT in the corresponding row of pixel units are coupled.

In the above solution, one shift register can simultaneously provide driving signals for two gate lines coupled to the pixel unit, so that no additional shift register needs to be provided for the gate line G1 coupled to the control electrode of the display switching transistor QTFT, the number of shift registers in the display panel can be effectively reduced, and narrow-bezel design is facilitated.

FIG. 11 is a schematic circuit diagram of another shift register according to some embodiments of the present disclosure. Compared with the above-described embodiment, the number of signal output terminals in the embodiment shown in FIG. 11 is three (OUT/OUT'/OUT"), and accordingly, the number of output sub-circuits 5 is three. The sixth display transistors M6/M6'/M6" in the output sub-circuits 5 are turned on or off at the same time, and the seventh display transistors M7/M7'/M7" in the output sub-circuits 5 are turned on or off at the same time.

In some embodiments, one of the three signal output terminals OUT/OUT'/OUT" is configured to provide a cascade signal to other shift register in the gate driving circuit, and the other two signal output terminals are configured to provide driving signals to the gate line G1 coupled to the control electrodes of the display switching transistors QTFT and the gate line G2 coupled to the control electrodes of the sensing switching transistors STFT in the corresponding row of pixel units, respectively (the operation timings of the driving clock signals in the driving clock signal terminals corresponding to the two signal output terminals may refer to FIG. 10).

In some embodiments, one of the three signal output terminals OUT/OUT'/OUT" is configured to provide a driving signal to the gate line G2 to which the control electrodes of the sensing switching transistors STFT in the corresponding row of pixel units is coupled, and the other two signal output terminals are configured to provide cascade signals to other shift registers in the gate driving circuit (the operation timings of the driving clock signals in the three driving clock signal terminals CLKD may be the same).

FIG. 12 is a schematic circuit diagram of another shift register according to some embodiments of the present disclosure. Compared with the above-described embodiment, the number of signal output terminals in the embodiment shown in FIG. 12 is four (OUT/OUT'/OUT"/OUT"') and accordingly, the number of output sub-circuits 5 is four. The sixth display transistors M6/M6'/M6"/M6"' in the output sub-circuits 5 are turned on or off at the same time, and the seventh display transistors M7/M7'/M7"/M7"' in the output sub-circuits 5 are turned on or off at the same time.

In some embodiments, two of the four signal output terminals OUT/OUT'/OUT"/OUT"' are configured to provide cascade signals to other shift registers in the gate driving circuit (the driving clock signals in the driving clock signal terminals CLKD corresponding to the two signal output terminals may be the same), and the other two signal output terminals are configured to provide driving signals to the gate line G1 coupled to the control electrodes of the display switching transistors QTFT and the gate line G2 coupled to the control electrodes of the sensing switching transistors STFT in the corresponding row of pixel units, respectively (the operation timings of the driving clock signals in the driving clock signal terminals CLKD corresponding to the two signal output terminals may refer to FIG. 10).

Figure 13:
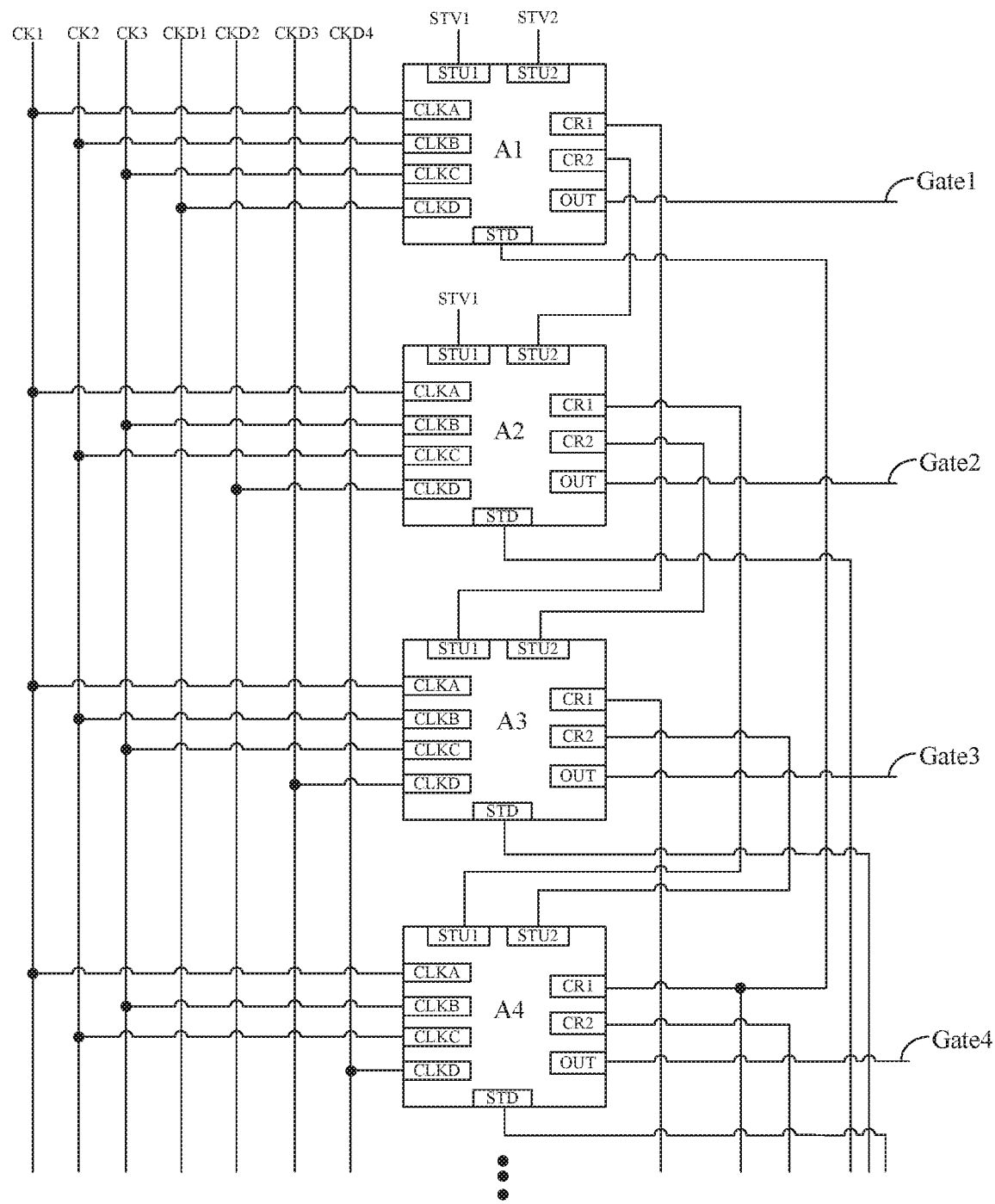
FIG. 13 is a schematic structural diagram of a gate driving circuit according to some embodiments of the present disclosure.

In another aspect, the present disclosure further provides a gate driving circuit. FIG. 13 is a schematic structural diagram of a gate driving circuit according to some embodiments of the present disclosure. As shown in FIG. 13, in some embodiments, the gate driving circuit includes N cascaded shift registers A1/A2/A3/A4, each of which adopts any one of the shift registers in the above embodiments.

It should be noted that the schematic diagram of only shift registers in first four stages is given by way of example in the figure.

As shown in FIG. 13, the first signal input terminals STU1 of the shift registers A1/A2 in the first and second stages are coupled to a frame start signal input terminal. STV1, and the first signal input terminal STU1 of the shift register in an i-th stage is coupled to a signal output terminal of the shift register in an (i−2)-th stage, where 3≤i≤N, and i is a positive integer.

As shown in FIG. 13, the second signal input terminal STU2 of the shift register A1 in the first stage is coupled to a sensing start signal input terminal STV2, and the second signal input terminal STU2 of the shift register in a j-th stage is coupled to a signal output terminal of the shift register in a (j−1)-th stage, where 2≤j≤N, and j is a positive integer.

As shown in FIG. 13, the reset signal terminals STD of the shift registers in (N−2)-th to N-th stages are coupled to a frame reset signal terminal (not shown), and the reset signal terminal STD in a k-th stage is coupled to a signal output terminal of the shift register in a (k+3)-th stage, where 1≤k≤N−3, and k is a positive integer.

For the first clock signal terminals CLKA to the third clock signal terminals CLKC of the shift registers in the gate driving circuit, three corresponding clock signal lines CK1/CK2/CK3 may be provided. The first clock signal terminal CLKA of each shift register is coupled to the first clock signal line CK1, the second clock signal terminals CLKB of the shift registers in odd-numbered stages are coupled to the second clock signal line CK2, the third clock signal terminals CLKC of the shift registers in the odd-numbered stages are coupled to the third clock signal line CK3, the second clock signal terminals CLKB of the shift registers in even-numbered stages are coupled to the third clock signal line CK3, and the third clock signal terminals CLKC of the shift registers in the even-numbered stages is coupled to the second clock signal line CK2.

For the driving clock signal terminals CLKD in the gate driving circuit, four corresponding driving clock signal lines CKD1/CKD2/CKD3/CKD4 may be provided. The driving clock signal terminal CLKD of the shift register in a (4m−3)-th stage is coupled to the first driving clock signal line CKD1, the driving clock signal terminal CLKD of the shift register in a (4m−2)-th stage is coupled to the second driving clock signal line CKD2, the driving clock signal terminal CLKD of the shift register in a (4m−1)-th stage is coupled to the third driving clock signal line CKD3, and the driving clock signal terminal CLKD of the shift register in a 4m-th stage is coupled to the fourth driving clock signal line CKD4, where 1≤m≤N, and m is a positive integer.

In some embodiments, the shift register A1/A2/A3/A4 in each stage is coupled to three corresponding signal output terminals CR1/CR2/OUT, which are respectively a first cascade signal output terminal CR1 (configured to provide a cascade signal to other shift register in the gate driving circuit), a second cascade signal output terminal CR2 (configured to provide a cascade signal to other shift register in the gate driving circuit), and a first driving signal output terminal OUT (configured to provide a driving signal to the gate line G2 coupled to the control electrodes of the sensing switching transistors STFT in the corresponding row of pixel units). The first signal input terminal STU1 of the shift register in the i-th stage is coupled to the first cascade signal output terminal CR1 of the shift register in the (i−2)-th stage; the second signal input terminal STU2 of the shift register in the j-th stage is coupled to the second cascade signal output terminal CR2 of the shift register in the (j−1)-th stage; the reset signal terminal STD of the shift register in the k-th stage is coupled to the first cascade signal output terminal CR1 of the shift register in the (k+3)-th stage. The first driving signal output terminal OUT of the shift register in each stage is coupled to the gate line Gate 1/Gate 2/Gate3/Gate 4 in the corresponding row.

In some embodiments, the second power supply terminal coupled to the output sub-circuit 5 corresponding to the second cascade signal output terminal CR2 provides a low-level operating voltage VGL2 which is higher than the voltage VGL1 when the second clock signal line (third clock signal line) is in a low level state. In this case, when the control electrode of the first sensing transistor T1 in each shift register is at VGL1, the gate-source voltage of the first sensing transistor T1 is constantly less than 0, and the first sensing transistor T1 is not turned on by mistake.

Figure 14:
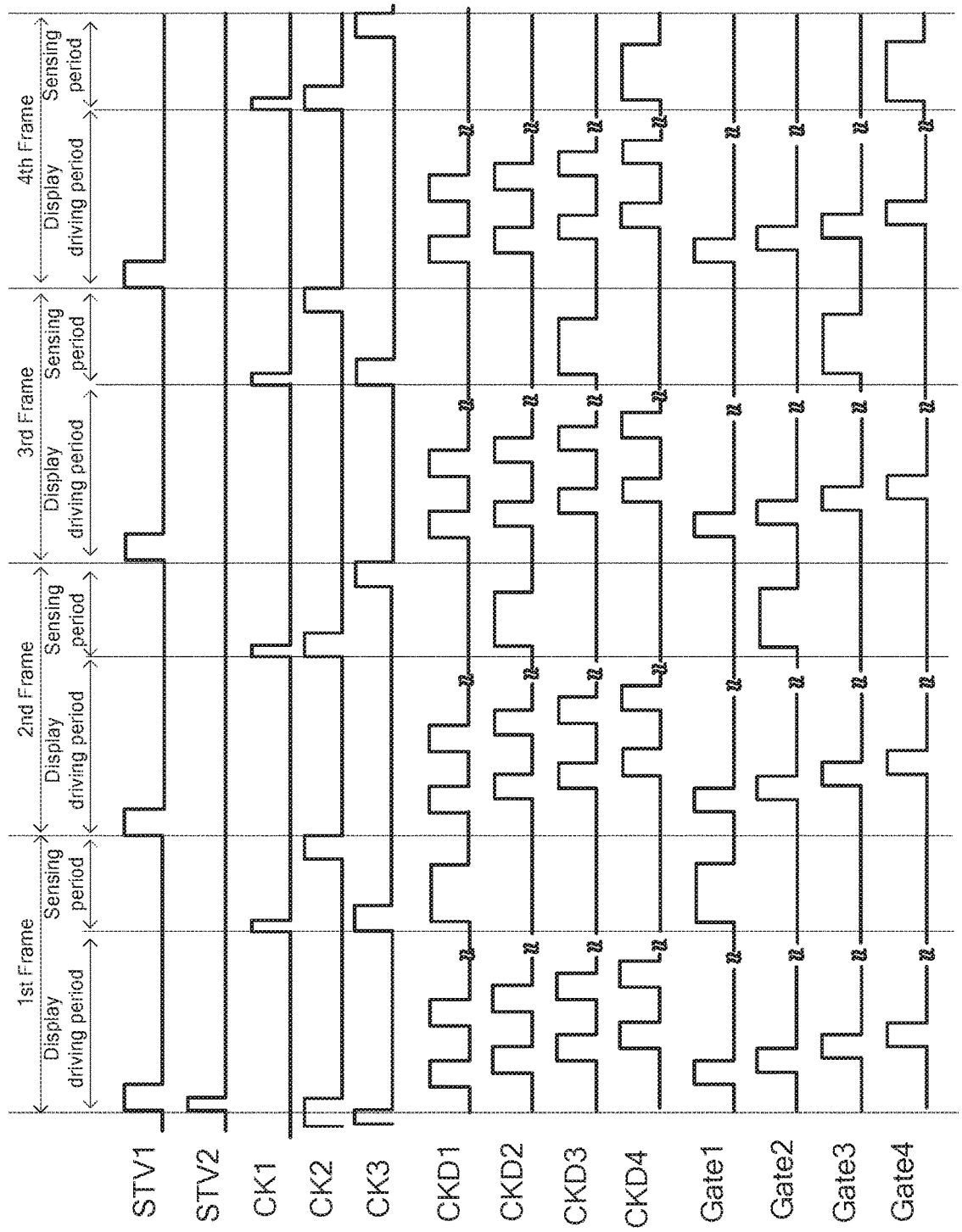
FIG. 14 is a timing diagram illustrating the operation of the gate driving circuit shown in FIG. 13.

FIG. 14 is a timing diagram illustrating the operation of the gate driving circuit shown in FIG. 13. As shown in FIG. 14, in the display driving period of each frame, the shift registers A1/A2/A3/A4 in respective stages sequentially output driving signals to gate lines Gate1/Gate2/Gate3/Gate4 in corresponding rows, so that the display panel performs image display; in the sensing period of each frame, only the shift register in one stage outputs a driving signal to sense the current of the display elements or the driving transistors in the corresponding row of pixel units for external compensation; each row of pixel units is externally compensated frame by frame.

It should be noted that the overlap ratio (overlap) of the driving signals of the gate lines in adjacent rows can be controlled by controlling the overlap ratio of the driving clock signals provided by the driving clock signal terminals CKD1 to CKD4.

In another aspect, the present disclosure further provides a display device. In some embodiments, the display device includes a gate driving circuit, which may adopt any of the gate driving circuits described herein.

Figure 15:
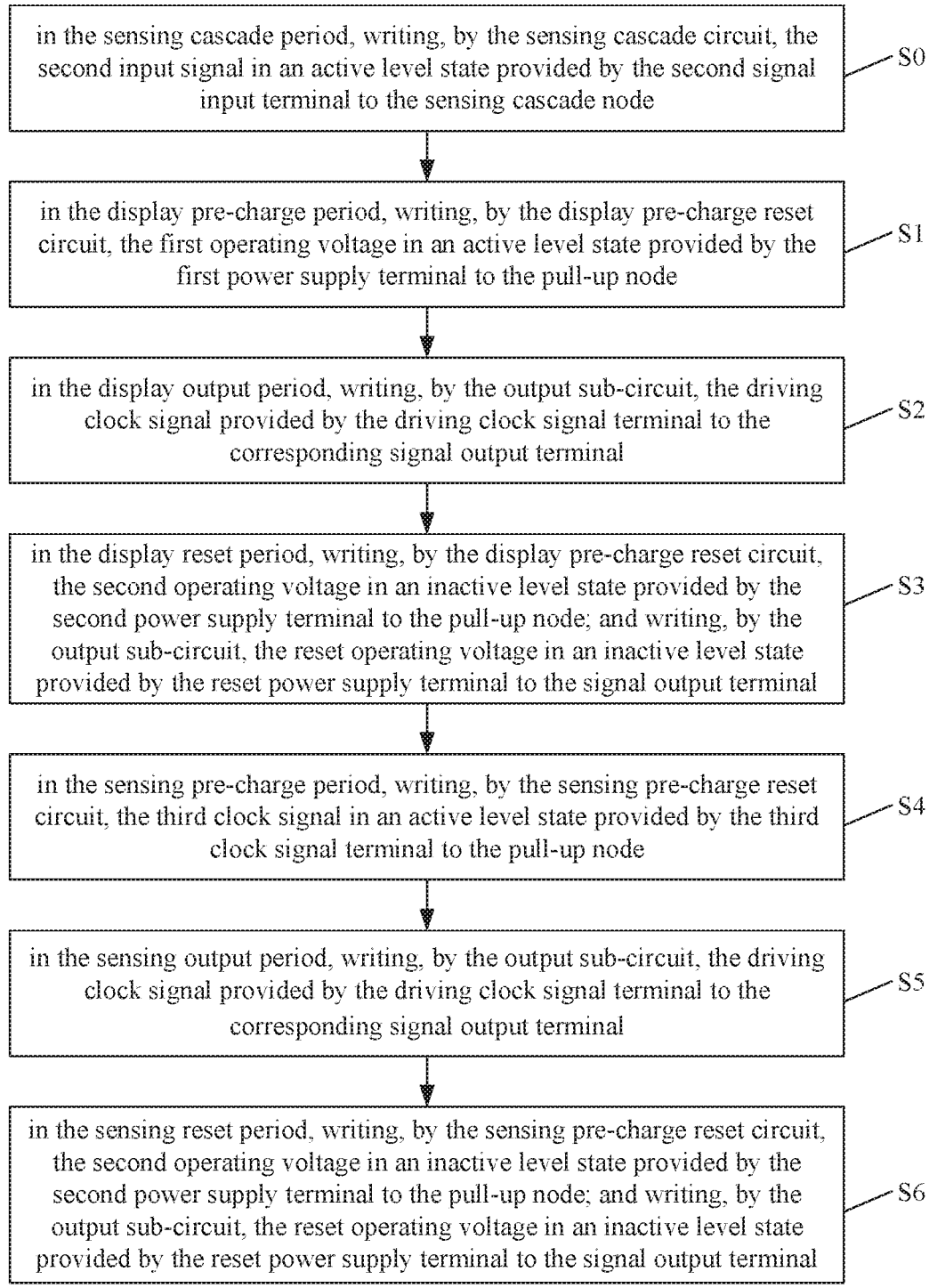
FIG. 15 is a flow chart of a gate driving method according to some embodiments of the present disclosure.

In another aspect, the present disclosure further provides a gate driving method. FIG. 15 is a flow chart of a gate driving method according to some embodiments of the present disclosure. The gate driving method is based on a shift register that adopts any of the shift registers described herein. As shown in FIG. 15, the gate driving method may include steps S0 to S6.

In step S0, in the sensing cascade period, the sensing cascade circuit writes the second input signal in an active level state provided by the second signal input terminal to the sensing cascade node in response to the control of the second clock signal provided by the second clock signal terminal.

In step S1, in the display pre-charge period, the display pre-charge reset circuit writes the first operating voltage in an active level state provided by the first power supply terminal to the pull-up node in response to the control of the first input signal provided by the first signal input terminal.

In step S2, in the display output period, the output sub-circuit writes the driving clock signal provided by the driving clock signal terminal to the corresponding signal output terminal in response to the control of the voltage at the pull-up node in an active level state.

In step S3, in the display reset period, the display pre-charge reset circuit writes the second operating voltage in an inactive level state provided by the second power supply terminal to the pull-up node in response to the control of the reset signal provided by the reset signal terminal; and the output sub-circuit writes the reset operating voltage in an inactive level state provided by the reset power supply terminal to the signal output terminal in response to the control of the voltage at the pull-down node in an active level state.

In step S4, in the sensing pre-charge period, the sensing pre-charge reset circuit writes the third clock signal in an active level state provided by the third clock signal terminal to the pull-up node in response to the control of the voltage at the sensing cascade node and the first clock signal provided by the first clock signal terminal.

In step S5, in the sensing output period, the output sub-circuit writes the driving clock signal provided by the driving clock signal terminal to the corresponding signal output terminal in response to the control of the voltage at the pull-up node in an active level state.

In step S6, in the sensing reset period, the sensing pre-charge reset circuit writes the second operating voltage in an inactive level state provided by the second power supply terminal to the pull-up node in response to the control of the second clock signal provided by the second clock signal terminal; and the output sub-circuit writes the reset operating voltage in an inactive level state provided by the reset power supply terminal to the signal output terminal in response to the control of the voltage at the pull-down node in an active level state.

For the detailed description of the steps S1 to S6, reference may be made to the contents in the foregoing embodiments, which are not repeated herein.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. A shift register, comprising an input circuit, an inverter circuit and an output circuit, the input circuit, the inverter circuit and the output circuit being coupled to a pull-up node, and the output circuit and the inverter circuit being coupled to a pull-down node, wherein the input circuit is configured to control a voltage at the pull-up node in response to an input signal;

the inverter circuit is configured to invert the voltage at the pull-up node and output the inverted voltage to the pull-down node; and the output circuit is configured to output a multi-pulse signal within a duration of one frame under control of the voltage at the pull-up node and a voltage at the pull-down node, wherein the input circuit comprises a display pre-charge reset circuit, a sensing cascade circuit and a sensing pre-charge reset circuit;

the sensing cascade circuit and the sensing pre-charge reset circuit are coupled to a sensing cascade node, and the display pre-charge reset circuit, the sensing pre-charge reset circuit and the output circuit are coupled to the pull-up node;

the display pre-charge reset circuit is coupled to a first signal input terminal, a reset signal terminal, a first power supply terminal and a second power supply terminal, and is configured to write a first operating voltage in an active level state provided by the first power supply terminal to the pull-up node in response to control of a first input signal provided by the first signal input terminal in a display pre-charge period, and to write a second operating voltage in an inactive level state provided by the second power supply terminal to the pull-up node in response to control of a reset signal provided by the reset signal terminal in a display reset period;

the sensing cascade circuit is coupled to a second signal input terminal and a second clock signal terminal, and is configured to write a second input signal in an active level state provided by the second signal input terminal to the sensing cascade node in response to control of a second clock signal provided by the second clock signal terminal in a sensing cascade period;

the sensing pre-charge reset circuit is coupled to a first clock signal terminal, the second clock signal terminal, a third clock signal terminal and the second power supply terminal, and is configured to write a third clock signal in an active level state provided by the third clock signal terminal to the pull-up node in response to control of a voltage at the sensing cascade node and a first clock signal provided by the first clock signal terminal in a sensing pre-charge period, and to write the second operating voltage in an inactive level state provided by the second power supply terminal to the pull-up node in response to control of the second clock signal provided by the second clock signal terminal in a sensing reset period;

wherein the output circuit is coupled to at least one signal output terminal and includes at least one output sub-circuit in one-to-one correspondence with the at least one signal output terminal, wherein an output sub-circuit of the at least one output sub-circuit is coupled to the pull-up node, the pull-down node, a corresponding signal output terminal, a corresponding driving clock signal terminal and a corresponding reset power supply terminal, is configured to write a driving clock signal provided by the corresponding driving clock signal terminal to the corresponding signal output terminal in response to control of the voltage at the pull-up node in an active level state in a display output period and a sensing output period, and is configured to write a reset operating voltage in an inactive level state provided by the corresponding reset power supply terminal to the corresponding signal output terminal in response to control of the voltage at the pull-down node in an active level state in the display reset period and the sensing reset period.

2. The shift register of claim 1, wherein the inverter circuit comprises a third display transistor, a fourth display transistor and a fifth display transistor;

a control electrode of the third display transistor is coupled to a third power supply terminal, a first electrode of the third display transistor is coupled to the third power supply terminal, and a second electrode of the third display transistor is coupled to the pull-down node;

a control electrode of the fourth display transistor is coupled to a fourth power supply terminal, a first electrode of the fourth display transistor is coupled to the fourth power supply terminal, and a second electrode of the fourth display transistor is coupled to the pull-down node;

a control electrode of the fifth display transistor is coupled to the pull-up node, a first electrode of the fifth display transistor is coupled to the pull-down node, and a second electrode of the fifth display transistor is coupled to the second power supply terminal; and a third operating voltage provided by the third power supply terminal and a fourth operating voltage provided by the fourth power supply terminal are both switched between an active level state and an inactive level state once every preset period, and one of the third operating voltage and the fourth operating voltage is in an active level state and the other is in an inactive level state at any time.

3. The shift register of claim 1, wherein the output sub-circuit comprises a sixth display transistor and a seventh display transistor;

a control electrode of the sixth display transistor is coupled to the pull-up node, a first electrode of the sixth display transistor is coupled to the corresponding driving clock signal terminal, and a second electrode of the sixth display transistor is coupled to the corresponding signal output terminal; and a control electrode of the seventh display transistor is coupled to the pull-down node, a first electrode of the seventh display transistor is coupled to the corresponding signal output terminal, and a second electrode of the seventh display transistor is coupled to the corresponding reset power supply terminal.

4. The shift register of claim 1, further comprising a first capacitor;

a first terminal of the first capacitor is coupled to the pull-up node, and a second terminal of the first capacitor is coupled to a signal output terminal of the at least one signal output terminal.

5. The shift register of claim 1, wherein a number of the at least one signal output terminal is 1 to 4.

6. The shift register of claim 1, wherein the sensing cascade circuit comprises a first sensing transistor; and a control electrode of the first sensing transistor is coupled to the second clock signal terminal, a first electrode of the first sensing transistor is coupled to the second signal input terminal, and a second electrode of the first sensing transistor is coupled to the sensing cascade node.

7. The shift register of claim 1, further comprising a second capacitor; wherein a first terminal of the second capacitor is coupled to the sensing cascade node, and a second terminal of the second capacitor is coupled to a fifth power supply terminal.

8. The shift register of claim 1, wherein a configuration of the output circuit satisfies one of following (i), (ii) and (iii):

(i) the output circuit comprises a first signal output terminal and a second signal output terminal, the first signal output terminal is configured to provide a cascade signal to a second shift register or configured to provide a driving signal to a gate line coupled to the first signal output terminal, and the second signal output terminal is configured to provide a driving signal to a gate line coupled to the second signal output terminal, (ii) the output circuit comprises a first signal output terminal, a second signal output terminal and a third signal output terminal;

the first signal output terminal is configured to provide a cascade signal to a second shift register;

the second signal output terminal is configured to provide a cascade signal to a third shift register or is configured to provide a driving signal to a first gate line coupled to the second signal output terminal; and the third signal output terminal is configured to provide a driving signal to a second gate line coupled to the third signal output terminal, and (iii) the output circuit comprises a first signal output terminal, a second signal output terminal, a third signal output terminal and a fourth signal output terminal;

the first signal output is configured to provide a cascade signal to a second shift register;

the second signal output is configured to provide a cascade signal to a third shift register;

the third signal output terminal is configured to provide a driving signal to a first gate line coupled to the third signal output terminal; and the fourth signal output terminal is configured to provide a driving signal to a second gate line coupled to the fourth signal output terminal.

9. The shift register of claim 1, further comprising a noise reduction circuit, wherein the noise reduction circuit comprises an eighth display transistor; and a control electrode of the eighth display transistor is coupled to the pull-down node, a first electrode of the eighth display transistor is coupled to the pull-up node, and a second electrode of the eighth display transistor is coupled to the second power supply terminal.

10. The shift register of claim 9, further comprising an anti-leakage circuit, wherein the anti-leakage circuit comprises a first anti-leakage transistor and a third anti-leakage transistor, and the second electrode of the eighth display transistor is coupled to the second power supply terminal through the third anti-leakage transistor;

a control electrode of the first anti-leakage transistor is coupled to one of the at least one signal output terminal, a first electrode of the first anti-leakage transistor is coupled to the second electrode of the eighth display transistor and a first electrode of the third anti-leakage transistor, and a second electrode of the first anti-leakage transistor is coupled to one of the at least one signal output terminal; and a control electrode of the third anti-leakage transistor is coupled to the control electrode of the eighth display transistor, the first electrode of the third anti-leakage transistor is coupled to the second electrode of the eighth display transistor, and a second electrode of the third anti-leakage transistor is coupled to the second power supply terminal.

11. The shift register of claim 1, wherein the sensing pre-charge reset circuit comprises a second sensing transistor, a third sensing transistor and a fourth sensing transistor;

a control electrode of the second sensing transistor is coupled to the sensing cascade node, a first electrode of the second sensing transistor is coupled to the third clock signal terminal, and a second electrode of the second sensing transistor is coupled to a first electrode of the third sensing transistor;

a control electrode of the third sensing transistor is coupled to the first clock signal terminal, and a second electrode of the third sensing transistor is coupled to the pull-up node; and a control electrode of the fourth sensing transistor is coupled to the second clock signal terminal, a first electrode of the fourth sensing transistor is coupled to the pull-up node, and a second electrode of the fourth sensing transistor is coupled to the second power supply terminal.

12. The shift register of claim 11, further comprising an anti-leakage circuit, wherein the anti-leakage circuit comprises a first anti-leakage transistor, a fourth anti-leakage transistor and a fifth anti-leakage transistor, the first electrode of the third sensing transistor is coupled to the second electrode of the second sensing transistor through the fourth anti-leakage transistor, and the second electrode of the fourth sensing transistor is coupled to the second power supply terminal through the fifth anti-leakage transistor;

a control electrode of the first anti-leakage transistor is coupled to one of the at least one signal output terminal, a first electrode of the first anti-leakage transistor is coupled to the first electrode of the third sensing transistor, a second electrode of the fourth anti-leakage transistor, the second electrode of the fourth sensing transistor and a first electrode of the fifth anti-leakage transistor, and a second electrode of the first anti-leakage transistor is coupled to one of the at least one signal output terminal;

a control electrode of the fourth anti-leakage transistor is coupled to the control electrode of the third sensing transistor, a first electrode of the fourth anti-leakage transistor is coupled to the second electrode of the second sensing transistor, and the second electrode of the fourth anti-leakage transistor is coupled to the first electrode of the third sensing transistor; and a control electrode of the fifth anti-leakage transistor is coupled to the control electrode of the fourth sensing transistor, the first electrode of the fifth anti-leakage transistor is coupled to the second electrode of the fourth sensing transistor, and a second electrode of the fifth anti-leakage transistor is coupled to the second power supply terminal.

13. A gate driving circuit, comprising N shift registers that are cascaded, each of the N shift registers being the shift register of claim 1; wherein first signal input terminals of the shift registers in first and second stages are coupled to a frame start signal input terminal, and a first signal input terminal of the shift register in an i-th stage is coupled to a signal output terminal of the shift register in an (i−2)-th stage, where 3≤i≤N, and i is a positive integer;

a second signal input terminal of the shift register in the first stage is coupled to a sensing start signal input terminal, and a second signal input terminal of the shift register in a j-th stage is coupled to a signal output terminal of the shift register in a (j−1)-th stage, where 2≤j≤N, and j is a positive integer; and reset signal terminals of the shift registers in (N−2)-th to N-th stages are coupled to a frame reset signal terminal, and a reset signal terminal in a k-th stage is coupled to a signal output terminal of the shift register in a (k+3)-th stage, where 1≤k≤N−3, and k is a positive integer.

14. The gate driving circuit of claim 13, wherein the shift register in each stage is coupled to three corresponding signal output terminals, which are a first cascade signal output terminal, a second cascade signal output terminal and a first driving signal output terminal;

the first signal input terminal of the shift register in the i-th stage is coupled to the first cascade signal output terminal of the shift register in the (i−2)-th stage;

the second signal input terminal of the shift register in the j-th stage is coupled to the second cascade signal output terminal of the shift register in the (j−1)-th stage;

the reset signal terminal of the shift register in the k-th stage is coupled to the first cascade signal output terminal of the shift register in the (k+3)-th stage; and the first driving signal output terminal of the shift register in each stage is coupled to a gate line in a corresponding row.

15. A display device, comprising a gate driving circuit, wherein the gate driving circuit is the gate driving circuit of claim 13.

16. The shift register of claim 1, wherein the display pre-charge reset circuit comprises a first display transistor and a second display transistor;

a control electrode of the first display transistor is coupled to the first signal input terminal, a first electrode of the first display transistor is coupled to the first power supply terminal, and a second electrode of the first display transistor is coupled to the pull-up node; and a control electrode of the second display transistor is coupled to the reset signal terminal, a first electrode of the second display transistor is coupled to the pull-up node, and a second electrode of the second display transistor is coupled to the second power supply terminal.

17. The shift register of claim 16, further comprising an anti-leakage circuit, wherein the anti-leakage circuit comprises a first anti-leakage transistor and a second anti-leakage transistor, and the second electrode of the second display transistor is coupled to the second power supply terminal through the second anti-leakage transistor;

a control electrode of the first anti-leakage transistor is coupled to one of the at least one signal output terminal, a first electrode of the first anti-leakage transistor is coupled to the second electrode of the second display transistor and a first electrode of the second anti-leakage transistor, and a second electrode of the first anti-leakage transistor is coupled to one of the at least one signal output terminal; and a control electrode of the second anti-leakage transistor is coupled to the control electrode of the second display transistor, the first electrode of the second anti-leakage transistor is coupled to the second electrode of the second display transistor, and a second electrode of the second anti-leakage transistor is coupled to the second power supply terminal.

18. The shift register of claim 17, wherein the one signal output terminal coupled to the control electrode of the first anti-leakage transistor and the one signal output terminal coupled to the second electrode of the first anti-leakage transistor are the same signal output terminal or different signal output terminals.

19. A gate driving method based on a shift register, the shift register comprising an input circuit, an inverter circuit and an output circuit, the input circuit, the inverter circuit and the output circuit being coupled to a pull-up node, and the output circuit and the inverter circuit being coupled to a pull-down node, wherein the input circuit is configured to control a voltage at the pull-up node in response to an input signal;

the inverter circuit is configured to invert the voltage at the pull-up node and output the inverted voltage to the pull-down node; and the output circuit is configured to output a multi-pulse signal within a duration of one frame under control of the voltage at the pull-up node and a voltage at the pull-down node, wherein the input circuit comprises a display pre-charge reset circuit, a sensing cascade circuit and a sensing pre-charge reset circuit;

the sensing cascade circuit and the sensing pre-charge reset circuit are coupled to a sensing cascade node, and the display pre-charge reset circuit, the sensing pre-charge reset circuit and the output circuit are coupled to the pull-up node;

the display pre-charge reset circuit is coupled to a first signal input terminal, a reset signal terminal, a first power supply terminal and a second power supply terminal, and is configured to write a first operating voltage in an active level state provided by the first power supply terminal to the pull-up node in response to control of a first input signal provided by the first signal input terminal in a display pre-charge period, and to write a second operating voltage in an inactive level state provided by the second power supply terminal to the pull-up node in response to control of a reset signal provided by the reset signal terminal in a display reset period;

the sensing cascade circuit is coupled to a second signal input terminal and a second clock signal terminal, and is configured to write a second input signal in an active level state provided by the second signal input terminal to the sensing cascade node in response to control of a second clock signal provided by the second clock signal terminal in a sensing cascade period;

the sensing pre-charge reset circuit is coupled to a first clock signal terminal, the second clock signal terminal, a third clock signal terminal and the second power supply terminal, and is configured to write a third clock signal in an active level state provided by the third clock signal terminal to the pull-up node in response to control of a voltage at the sensing cascade node and a first clock signal provided by the first clock signal terminal in a sensing pre-charge period, and to write the second operating voltage in an inactive level state provided by the second power supply terminal to the pull-up node in response to control of the second clock signal provided by the second clock signal terminal in a sensing reset period;

wherein the output circuit is coupled to at least one signal output terminal and includes at least one output sub-circuit in one-to-one correspondence with the at least one signal output terminal, wherein an output sub-circuit of the at least one output sub-circuit is coupled to the pull-up node, the pull-down node, a corresponding signal output terminal, a corresponding driving clock signal terminal and a corresponding reset power supply terminal, is configured to write a driving clock signal provided by the corresponding driving clock signal terminal to the corresponding signal output terminal in response to control of the voltage at the pull-up node in an active level state in a display output period and a sensing output period, and is configured to write a reset operating voltage in an inactive level state provided by the corresponding reset power supply terminal to the corresponding signal output terminal in response to control of the voltage at the pull-down node in an active level state in the display reset period and the sensing reset period; and wherein the gate driving method comprises:

in the sensing cascade period, writing, by the sensing cascade circuit, the second input signal in an active level state provided by the second signal input terminal to the sensing cascade node in response to the control of the second clock signal provided by the second clock signal terminal;

in the display pre-charge period, writing, by the display pre-charge reset circuit, the first operating voltage in an active level state provided by the first power supply terminal to the pull-up node in response to the control of the first input signal provided by the first signal input terminal;

in the display output period, writing, by the output sub-circuit, the driving clock signal provided by the corresponding driving clock signal terminal to the corresponding signal output terminal in response to the control of the voltage at the pull-up node in an active level state;

in the display reset period, writing, by the display pre-charge reset circuit, the second operating voltage in an inactive level state provided by the second power supply terminal to the pull-up node in response to the control of the reset signal provided by the reset signal terminal; and writing, by the output sub-circuit, the reset operating voltage in an inactive level state provided by the corresponding reset power supply terminal to the corresponding signal output terminal in response to the control of the voltage at the pull-down node in an active level state;

in the sensing pre-charge period, writing, by the sensing pre-charge reset circuit, the third clock signal in an active level state provided by the third clock signal terminal to the pull-up node in response to the control of the voltage at the sensing cascade node and the first clock signal provided by the first clock signal terminal;

in the sensing output period, writing, by the output sub-circuit, the driving clock signal provided by the corresponding driving clock signal terminal to the corresponding signal output terminal in response to the control of the voltage at the pull-up node in an active level state; and in the sensing reset period, writing, by the sensing pre-charge reset circuit, the second operating voltage in an inactive level state provided by the second power supply terminal to the pull-up node in response to the control of the second clock signal provided by the second clock signal terminal; and writing, by the output sub-circuit, the reset operating voltage in an inactive level state provided by the corresponding reset power supply terminal to the corresponding signal output terminal in response to the control of the voltage at the pull-down node in an active level state.

\* \* \* \* \*